(12) United States Patent
Kawano et al.

(10) Patent No.: US 8,582,312 B2
(45) Date of Patent: Nov. 12, 2013

(54) ELECTRONIC CIRCUIT BOARD AND POWER LINE COMMUNICATION APPARATUS USING IT

(75) Inventors: Hiroshi Kawano, Miyazaki (JP);
Shuichiro Yamaguchi, Miyazaki (JP);
Takumi Naruse, Miyazaki (JP);
Toshihiro Yamauchi, Miyazaki (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/933,860

(22) PCT Filed: Mar. 24, 2009

(86) PCT No.: PCT/JP2009/001308
§ 371 (c)(1),
(2), (4) Date: Sep. 21, 2010

(87) PCT Pub. No.: WO2009/119077
PCT Pub. Date: Oct. 1, 2009

(65) Prior Publication Data
US 2011/0019381 A1      Jan. 27, 2011

(30) Foreign Application Priority Data

Mar. 24, 2008  (JP) .................................. 2008-076372
Mar. 24, 2008  (JP) .................................. 2008-076373

(51) Int. Cl.
*H05K 7/00*      (2006.01)
*H05K 1/14*      (2006.01)
*H05K 1/16*      (2006.01)
*H05K 1/11*      (2006.01)

(52) U.S. Cl.
USPC ........... 361/760; 361/748; 361/792; 361/794; 174/260; 174/261

(58) Field of Classification Search
USPC ......... 361/803, 761–764, 790, 760, 792, 794, 361/783–785, 749, 808, 748; 174/267, 261, 174/260; 257/678; 439/138
See application file for complete search history.

(56) References Cited

U.S. PATENT DOCUMENTS 5,166,865 A * 11/1992 Morrison et al. ............. 361/760
5,488,540 A *  1/1996 Hatta ............................ 361/794
(Continued)

FOREIGN PATENT DOCUMENTS

JP      63-170988      7/1988
JP      04-252624      9/1992
(Continued)

OTHER PUBLICATIONS

Machine Translation of JP 2007-287783 A: Kono et al., Integrated Circuit Mounting Substrate and Power-Line.*

(Continued)

*Primary Examiner* — Timothy Thompson
*Assistant Examiner* — Sherman Ng
(74) *Attorney, Agent, or Firm* — Seed IP Law Group PLLC

(57) ABSTRACT

A highly reliable electronic circuit board for suppressing propagation of noise and a power line communication apparatus using it are provided. An electronic circuit board of the invention is connected to a different electronic circuit board and including a first board having a first face and a second face opposed to the first face and a second board having a third face and a fourth face opposed to the third face. The electronic circuit board includes a first circuit mounted on one end of the first face for performing analog signal processing; a second circuit mounted on another end of the first face for performing digital signal processing; a junction layer provided between the second face and the third face for jointing the first board and the second board; a built-in electronic component built into the junction layer; a connection part mounted on the fourth face and to be connected to the different electronic circuit board; and a first conducting path for electrically connecting the second circuit and the connection part, wherein the connection part is mounted at a position overlapping projection projecting the second circuit onto the fourth face from a vertical direction relative to the first face.

17 Claims, 20 Drawing Sheets

(56) References Cited

U.S. PATENT DOCUMENTS

| | | | |
|---|---|---|---|
| 6,038,133 A * | 3/2000 | Nakatani et al. | 361/760 |
| 6,274,978 B1 * | 8/2001 | Roach et al. | 313/483 |
| 6,396,711 B1 * | 5/2002 | Degani et al. | 361/760 |
| 6,472,613 B1 * | 10/2002 | Reichard | 174/261 |
| 6,747,356 B2 * | 6/2004 | Ando et al. | 257/758 |
| 6,849,935 B2 * | 2/2005 | Palanisamy | 257/678 |
| 2004/0188814 A1 * | 9/2004 | Houle et al. | 257/678 |
| 2007/0002599 A1 * | 1/2007 | Caven | 363/144 |
| 2007/0064402 A1 * | 3/2007 | Schumacher | 361/785 |
| 2007/0153491 A1 * | 7/2007 | Lee | 361/790 |
| 2008/0123302 A1 | 5/2008 | Kawano | |

FOREIGN PATENT DOCUMENTS

| | | |
|---|---|---|
| JP | 10-190167 | 7/1998 |
| JP | 11-145570 | 5/1999 |
| JP | 2000-353895 | 12/2000 |
| JP | 3375555 | 11/2002 |
| JP | 2003-297963 | 10/2003 |
| JP | 2006-135202 | 5/2006 |
| JP | 2007-027455 | 2/2007 |
| JP | 2007-287783 | 11/2007 |
| JP | 2007287783 A * | 11/2007 |

OTHER PUBLICATIONS

International Search Report dated Jun. 30, 2009.

Y. Sugaya, et al., "Downsizing Module Technology Using Embedding SMD Components & Sheet Capacitor into Substrate," The Institute of Electronics, Information and Communication Engineers, Reference No. 2913090223, Dispatch No. 633437, Sep. 18, 2012, pp. 2-11, with English translation.

S. Karashima, et al., "Reduction of Power Line Noise Using Embedded Sheet Capacitor in Printed Circuit Board," The Institute of Electronics, Information and Communication Engineers, Reference No. 2913090223, Dispatch No. 633438, Sep. 18, 2012, pp. 2-9, with partial English translation.

* cited by examiner

FIG.12
(a)
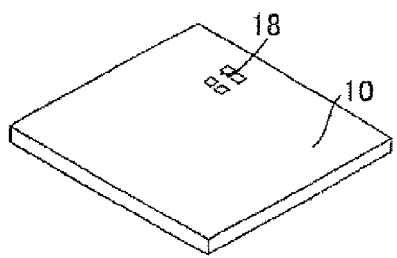
(b)
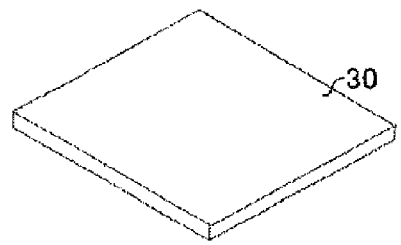
(c)
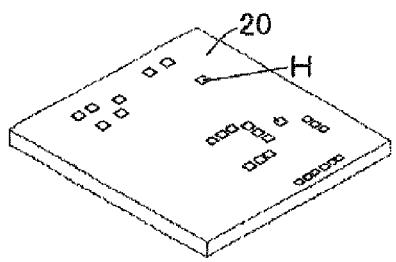
(d)
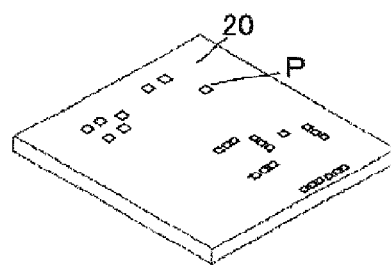
(e)
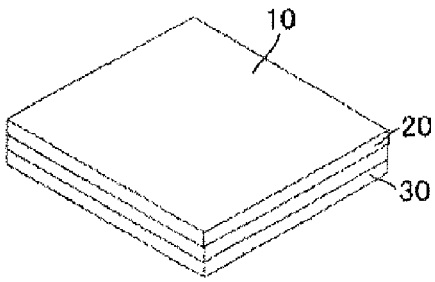
(f)
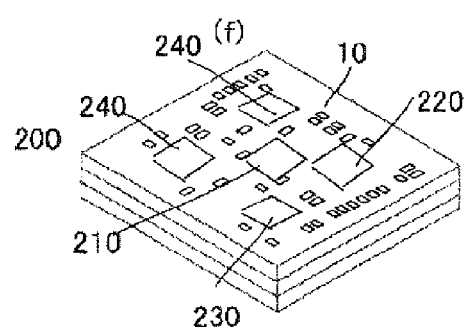

FIG.17
(a)
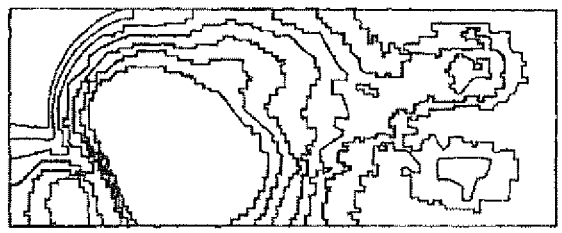
ELECTRIC FIELD PEAK VALUE:
104.25 dBuV @ 61.3 MHz
(b)
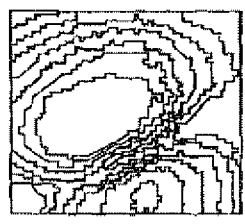
ELECTRIC FIELD PEAK VALUE:
98.72 dBuV @ 61.3 MHz
(c)
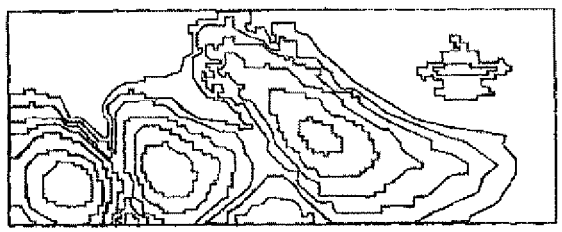
ELECTRIC FIELD PEAK VALUE:
96.47 dBuV @ 125 MHz
(d)
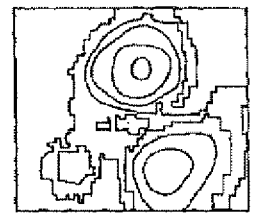
ELECTRIC FIELD PEAK VALUE:
90.33 dBuV @ 125 MHz

FIG.23
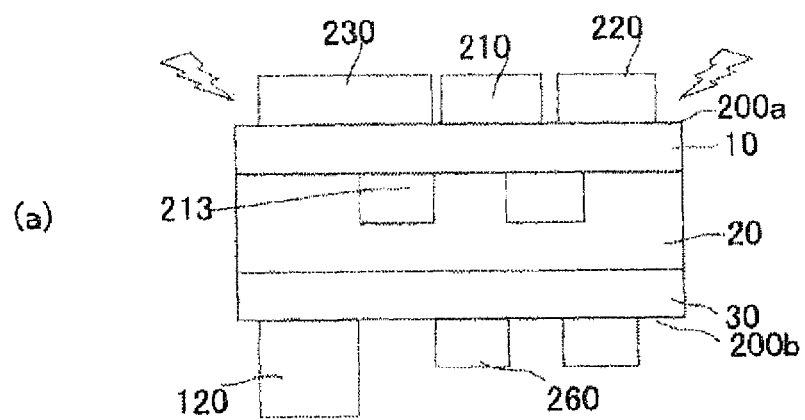
(a)
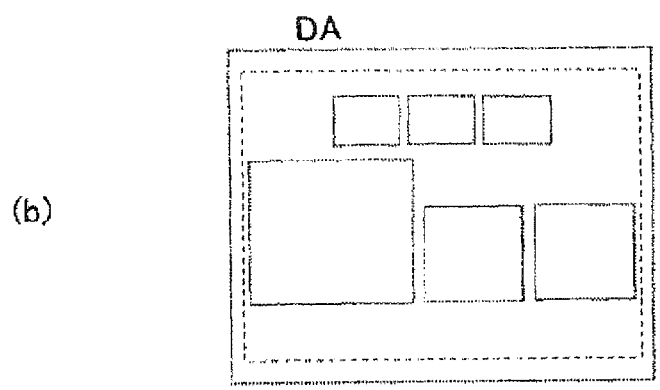
(b)
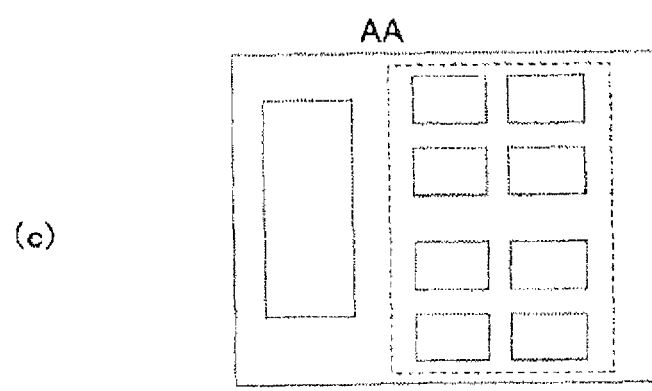
(c)

ELECTRONIC CIRCUIT BOARD AND POWER LINE COMMUNICATION APPARATUS USING IT

TECHNICAL FIELD

The present invention relates to an electronic circuit board and a power line communication apparatus using it, and in particular to the mounting structure and radiation measures of a semiconductor integrated circuit used in an environment in which noise countermeasures are strict such as high-speed power line communications (PLC).

BACKGROUND ART

With requirement for miniaturization of electronic components, in a circuit module in which semiconductor integrated circuits and circuit components are installed, it is necessary to install a large number of semiconductor circuit chips and circuit components and a demand for effective utilization of a wiring space and a mount space grows.

Particularly, a signal used in an optical communication field is a digital signal and thus an analog signal connected to output of a light reception element and a digital circuit installed for the purpose of for synchronizing a reception signal, etc., are mixed. Thus, there is a problem in that noise occurring in the digital circuit invites characteristic degradation of the analog circuit and hitherto various measures have been considered.

As an example, a structure wherein an analog circuit is placed on one face and a digital circuit is placed on an opposite face across a grounded conductor plate is proposed (Patent Document 1).

According to the configuration, electromagnetic wave noise caused by the digital circuit is blocked by the conductor plate and does not arrive at the analog circuit and thus noise can be decreased. The device can be miniaturized because of double-face mounting configuration.

The applicant proposes various structures such as a structure wherein the area of bypass capacitor power supply wiring is made narrow so that a high frequency current occurring from an IC power supply terminal does not pass through a bypass capacitor and a power supply pattern for an IC power supply terminal and a power supply pattern for external power supply are spatially separately provided in a multilayer circuit board which easily becomes a generation source of unnecessary radiation noise (Patent Document 2).

Particularly, in a modulation/demodulation IC for modulating and demodulating, a large number of ground terminals (pads) are placed at narrow pitches and are connected onto a mount board. As the mount board, a stack board with a plurality of wiring layers stacked through an insulating layer is used (Patent Document 3).

In such a stack board, to lessen routing of wiring as much as possible and decrease impedance caused by the wiring, usually a power supply line and a ground line of the wiring layers are formed each in a plate and are embedded in the stack board as a power supply plate and a ground plate.

In an electronic device often involving mounting of a high heat generating component of an amplifier, etc., various radiation structures are proposed and a structure wherein a base board such as a metal base board is caused to radiate is proposed (for example, Patent Document 4).

Patent Document 1: JP-A-1992-252624/1992
Patent Document 2: JP-A-2003-297963
Patent Document 3: JP-B-3375555
Patent Document 4: JP-A-2006-135202

DISCLOSURE OF THE INVENTION

Problems to be Solved by the Invention

In recent years, in the PLC field, not only a planar occupation area, but also the distance in a perpendicular direction cannot overlooked and an increase in inductance caused by an increase in the distance in the thickness direction of the stack board has become not a little problem. Under such circumstances, finer wiring length keeps on proceeding, miniaturization proceeds, the occupation area is about 60% of the conventional occupation area, higher density of components drastically advances, and unnecessary radiation noise becomes an extremely serious problem.

In view of the circumstances described above, it is an object of the invention to provide a highly reliable electronic circuit board for suppressing propagation of noise in further miniaturization of a device, element placement, and higher density of wiring and an electronic circuit using the electronic circuit board.

Means for Solving the Problems

The invention provides an electronic circuit board to be connected to a different electronic circuit board and including a first board having a first face and a second face opposed to the first face and a second board having a third face and a fourth face opposed to the third face, the electronic circuit board comprising: a first circuit mounted on one end of the first face for performing analog signal processing; a second circuit mounted on another end of the first face for performing digital signal processing; a junction layer provided between the second face and the third face for jointing the first board and the second board; a built-in electronic component built into the junction layer; a connection part mounted on the fourth face and to be connected to the different electronic circuit board; and a first conducting path for electrically connecting the second circuit and the connection part, wherein the connection part is mounted at a position overlapping projection projecting the second circuit onto the fourth face from a vertical direction relative to the first face.

Effects of the Invention

According to the invention, the first circuit for performing analog signal processing is mounted on one end and the second circuit for performing digital signal processing is mounted on the opposite end of the first face, whereby the first circuit is placed at a distance from the second circuit, so that the effect of noise of the second circuit on the first circuit can be decreased. Further, the connection part is mounted on the projection face of the second circuit on the second face, whereby it is made possible to shorten the line length of the conducting path for electrically connecting the second circuit and the connection part, so that it is made possible to decrease noise occurring from the conducting path. Accordingly, it is possible to decrease the effect of noise on the first circuit.

BRIEF DESCRIPTION OF THE DRAWINGS

In FIG. 12, (a) to (f) are perspective views to show one embodiment of a manufacturing process of the PLC module of Embodiment 1.

FIG. 17 is a schematic representation to show the measurement results of an in-plane electromagnetic field distribution of the PLC circuit module of Embodiment 1.

FIG. 23 is a schematic representation of a PLC circuit module of Embodiment 6; (a) is a sectional view; (b) is a plan view to show a first face; and (c) is a plan view to show a second face.

Figure 1:
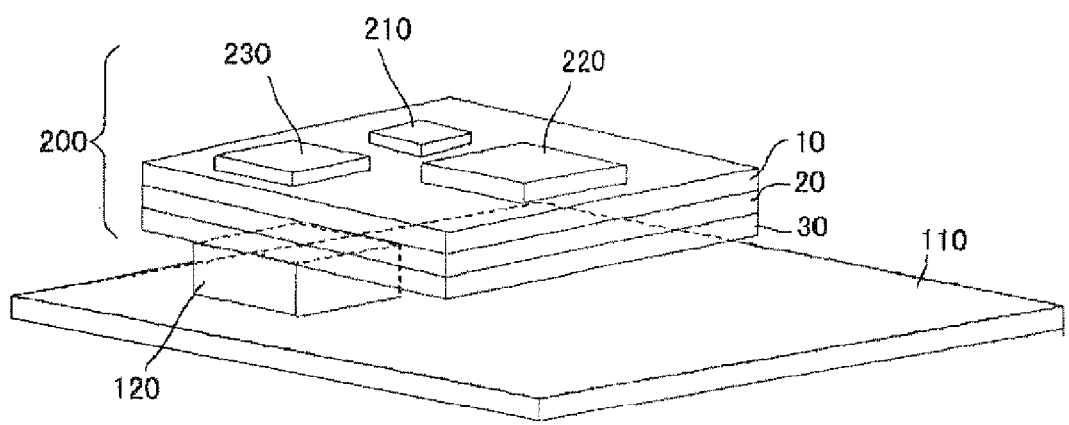
FIG. 1 is a perspective view to show a state in which a PLC circuit module using an electronic circuit board of Embodiment 1 is mounted on a mother board 110.

DESCRIPTION OF REFERENCE NUMERALS 11, 12, 13, 14, 15, 16 Metal layer
15 Ground layer
100 PLC modem
101 Housing
102 Power supply connector
103 RJ45 connector
105 Display section
200 Circuit module (for PLC)
210 PLC IC
211 CPU
212 PLC MAC block
213 PLC PHY block
220 AFE IC
221 D/A converter (DAC)
222 A/D converter (ADC)
223 Variable amplifier (VGA)
230 Ethernet (registered trademark) PHY IC
251 Low-pass filter
252 Operational amplifier (driver IC)
260 Balanced filter (band-pass filter)
270 Coupler
271 Coil transformer
272a, 272b Coupling capacitor
300 Switching power supply
400 Power supply plug
500 Outlet
600 Power supply cable
900 Power line
2110 Control unit
2111 Symbol mapper
2112 Serial-parallel converter
2113 Inverse wavelet transformer
2114 Wavelet transformer
2115 Parallel-serial converter
2116 Demapper

BEST MODE FOR CARRYING OUT THE INVENTION

According to a first aspect of the invention, there is provided an electronic circuit board to be connected to a different electronic circuit board and including a first board having a first face and a second face opposed to the first face and a second board having a third face and a fourth face opposed to the third face, the electronic circuit board comprising: a first circuit mounted on one end of the first face for performing analog signal processing; a second circuit mounted on another end of the first face for performing digital signal processing; a junction layer provided between the second face and the third face for jointing the first board and the second board; a built-in electronic component built into the junction layer; a connection part mounted on the fourth face and to be connected to the different electronic circuit board; and a first conducting path for electrically connecting the second circuit and the connection part, wherein the connection part is mounted at a position overlapping projection projecting the second circuit onto the fourth face from a vertical direction relative to the first face.

According to the configuration, the first circuit for performing analog signal processing is mounted on one end and the second circuit for performing digital signal processing is mounted on the other end of the first face, whereby the first circuit is placed at a distance from the second circuit, so that the effect of noise of the second circuit on the first circuit can be decreased. The first board and second board are joined, whereby it is possible to decrease the circuit mount area. The electronic circuit is built into the junction layer, whereby the circuit density can be improved. Further, the connection part is mounted overlapping projection of the second circuit on the fourth face, whereby it is possible to shorten the line length of the conducting path for electrically connecting the second circuit and the connection part, so that it is possible to decrease noise occurring from the conducting path. Accordingly, it is possible to decrease the effect of noise on the first circuit.

A second aspect of the invention provides an electronic circuit board, wherein an electronic component for performing analog signal processing is mounted on the fourth face.

According to the configuration, the electronic component for performing analog signal processing is mounted on the fourth face, whereby the electronic component is placed at a distance from the second circuit, so that the effect of noise of the second circuit on the electronic component can be decreased.

A third aspect of the invention provides an electronic circuit board, wherein at least either of the first board and the second board has a plurality of conductive layers stacked through an insulating layer.

According to the configuration, at least either of the first board and the second board is the stack board including the insulating layer and the conductive layer, so that it is possible to improve the circuit density of the electric circuit board and lessen the size of the electronic circuit board.

A fourth aspect of the invention provides an electronic circuit board, further comprising: an integrated circuit mounted on the first face for performing at least either of modulation processing and demodulation processing a multicarrier A fifth aspect of the invention provides an electronic circuit board, comprising: a second conducting path for electrically connecting the integrated circuit and the built-in electronic component.

A sixth aspect of the invention provides an electronic circuit board, wherein the second conducting path is provided perpendicularly to the first face.

According to the configuration, the second conducting path is provided perpendicularly to the first face, so that the line length of the second conducting path shortens and noise occurring from the second conducting path can be decreased.

A seventh aspect of the invention provides an electronic circuit board, wherein the thickness of the first circuit and the thickness of the second circuit are smaller than the thickness of the conductive layer.

According to the configuration, stress caused by thermal expansion of the first and second boards can be decreased, whereby the junction property of the board and the junction layer can be maintained.

An eighth aspect of the invention provides an electronic circuit board, wherein a radiation section is provided to abut on at least either of the first circuit and the second circuit.

According to the configuration, the radiation section abutting on at least either of the first circuit and the second circuit is provided, so that the radiation member serves as a role in forcibly emitting heat. Thus, heat generated from the first circuit and the second circuit is efficiently radiated, heat does not flow into the second face, and the effect of heat can be shut out.

A ninth aspect of the invention provides an electronic circuit board, wherein the multicarrier signal is a power line communication signal that is transmittable on a power line.

A tenth aspect of the invention provides a power line communication apparatus for conducting power line communications, comprising: the electronic circuit board as in the ninth aspect of the invention; and a coupler that is adapted to superpose a power line communication signal output from the electronic circuit board on an AC voltage transmitted through the power line, separating the power line communication signal from the AC voltage transmitted through the power line, and outputting the power line communication signal to the electronic circuit board.

According to the configuration, it is possible to provide the low-noise and high-reliability power line communication apparatus that can conduct high-speed communications.

An eleventh aspect of the invention provides an electronic circuit board, wherein the conductive layer includes an inorganic filler and a thermosetting resin.

According to the configuration, the coefficient of thermal expansion, the dielectric constant, and the heat conductivity can be controlled by selecting an inorganic filler. Connection reliability of the conducting path for connecting the two stack boards can be improved and the radiation property can be improved.

A twelfth aspect of the invention provides an electronic circuit board, wherein the inorganic filler in the junction layer is 70% by weight to 95% by weight.

According to the configuration, the coefficient of thermal expansion can be matched with the two stack boards and peeling off of the two stack boards and the insulating sheet including the conducting path can be prevented in temperature change of heat shock, etc., caused by the thermal expansion difference between the insulating sheet and the two stack boards, and the connection reliability of the conducting path connecting the two stack boards can be improved. Pressure applied to the circuit component mounted on the face in contact with the insulating sheet when the insulating sheet and the two stack boards are stacked is suppressed and damage to the circuit component can be prevented. The stack boards are formed between conductive layers formed with any desired pattern across the insulating layer; the insulating layer can also be made up of an inorganic filler and thermosetting resin. The insulating sheet is formed of thermosetting resin having a lower cure temperature than the insulating layer forming the stack substrate, whereby when the stack boards are fixed to each other through the insulating sheet, degradation of the insulating layer of the stack board by heat treatment can be prevented.

A thirteenth aspect of the invention provides an electronic circuit board, wherein the radiation section is connected to the first circuit and the second circuit through an insulative elastic body.

According to the configuration, the height difference between the first circuit and the second circuit mounted on the first face can be absorbed in the elastic member and adherence is enhanced, whereby the heat contact property can be enhanced and the radiation property can be more improved.

A fourteenth aspect of the invention provides an electronic circuit board, wherein a filter for blocking the power line communication signal of a predetermined frequency band is provided on the fourth face.

According to the configuration, the filter is provided on the fourth filter, so that the effect of noise occurring from the second circuit can be decreased.

A fifteenth aspect of the invention provides an electronic circuit board, wherein the filter is a balanced filter where impedances viewed from a pair of lines of the power line are almost the same.

Since wiring is conducted in a perpendicular direction to the second board, the line length can be decreased, so that occurrence of noise can be decreased. If noise occurs from the conducting path, the noise propagates in the inner layer of the board and is emitted, so that the effect of the noise on the analog component can be decreased.

Embodiments will be described below in detail with reference to the accompanying drawings:

(Embodiment 1)

In Embodiment 1, a PLC modem 100 that houses a PLC module used for high-speed power line communications (PLC) in a housing 101 will be described as an electronic circuit board. The PLC modem 100 is an example of a power line communication apparatus, and the power line communication apparatus may be an electric device containing a PLC modem.

Figure 2:
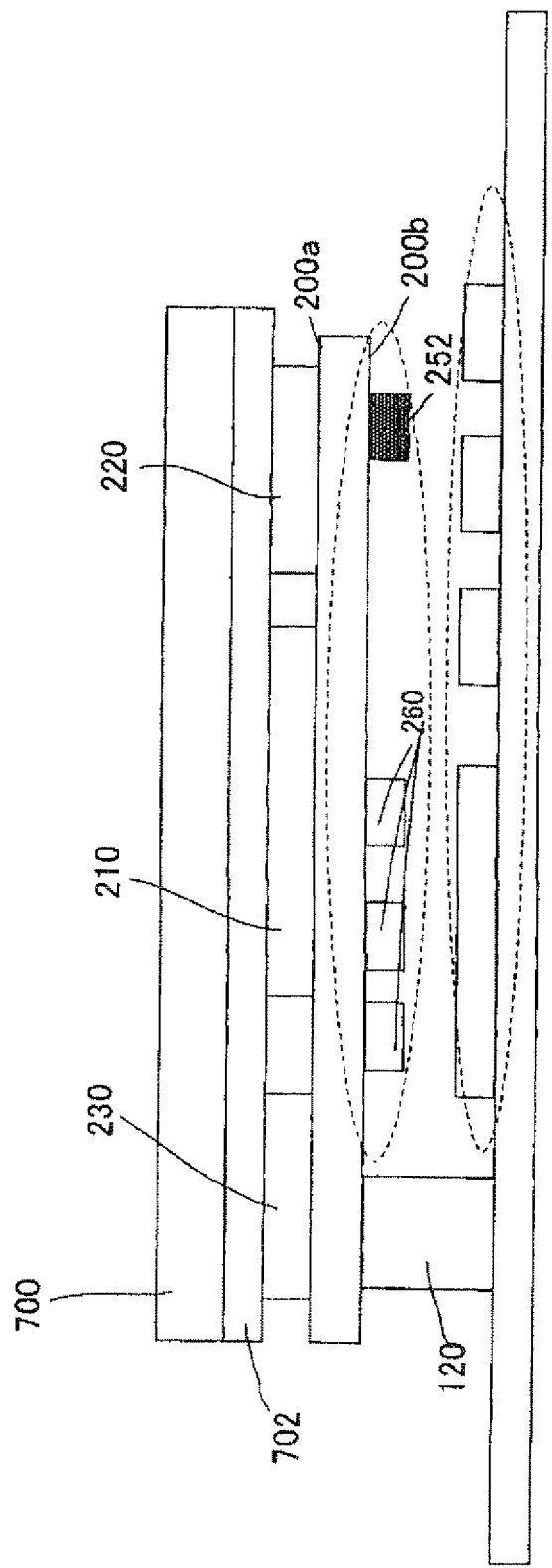
FIG. 2 is a cross-sectional schematic representation to show a state in which the PLC circuit module using the electronic circuit board of Embodiment 1 is mounted on the mother board 110.

In the embodiment, two electronic circuit boards attached to a mother board 110 through a connector 120 as a connection part configure a PLC circuit module 200 as shown in a perspective view of FIG. 1 and a cross-sectional schematic drawing of FIG. 2. That is, digital components such as an Ethernet (registered trademark) PHY IC 230 for modulating and demodulating a signal transmitted through an Ethernet (registered trademark) cable, a PLC IC 210 for modulating and demodulating a PLC signal (multicarrier signal) transmitted through a power line, and an AFE IC (Analog Front End IC) 220 for performing necessary signal processing for the PLC signal (for example, digital-analog conversion, etc.,) are installed on a first face 200a of the two electric circuit boards configuring the PLC circuit module 200 contained in the PLC modem 100. Balanced filters (band-pass filters) 260 and analog components of heating components of an operational amplifier 252, etc., are installed on a second face 200b of a face opposed to the first face 200a. The PLC circuit module 200 has a first stack board 10 and a second stack board 30 stacked through a composite sheet 20. On the rear side of the digital components, a radiation member 700 is provided so as to cover the whole of the first face 200a of the digital component installation face of the first stack board through an elastic member 701 of heat conductivity.

That is, the electronic circuit board of Embodiment 1 includes the digital components including the modulation and demodulation integrated circuit for performing digital signal processing, the band-pass filters 260 of balanced filters for blocking a power line communication signal of a predetermined frequency band, and boards with the first face on which the digital components are installed and the second face opposed to the first face on which the balanced filters 260 and the connector 120 as an external connection part are installed.

Figure 3:
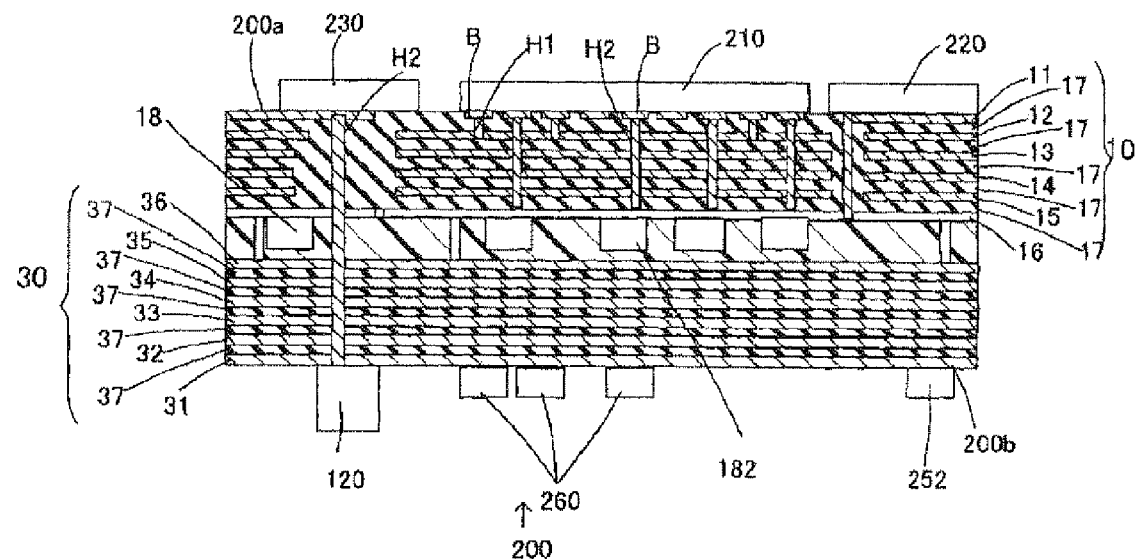
FIG. 3 is a cross-sectional schematic representation in main part to show the PLC circuit module using the electronic circuit board of Embodiment 1.
Figure 4:
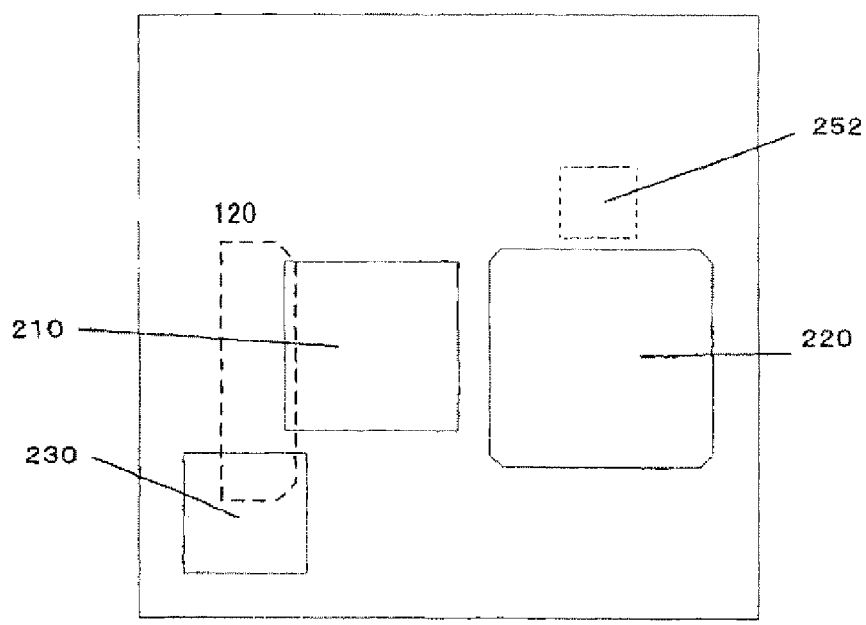
FIG. 4 shows a layout of the upper face of the electronic circuit board forming the PLC circuit module of Embodiment 1.
Figure 5:
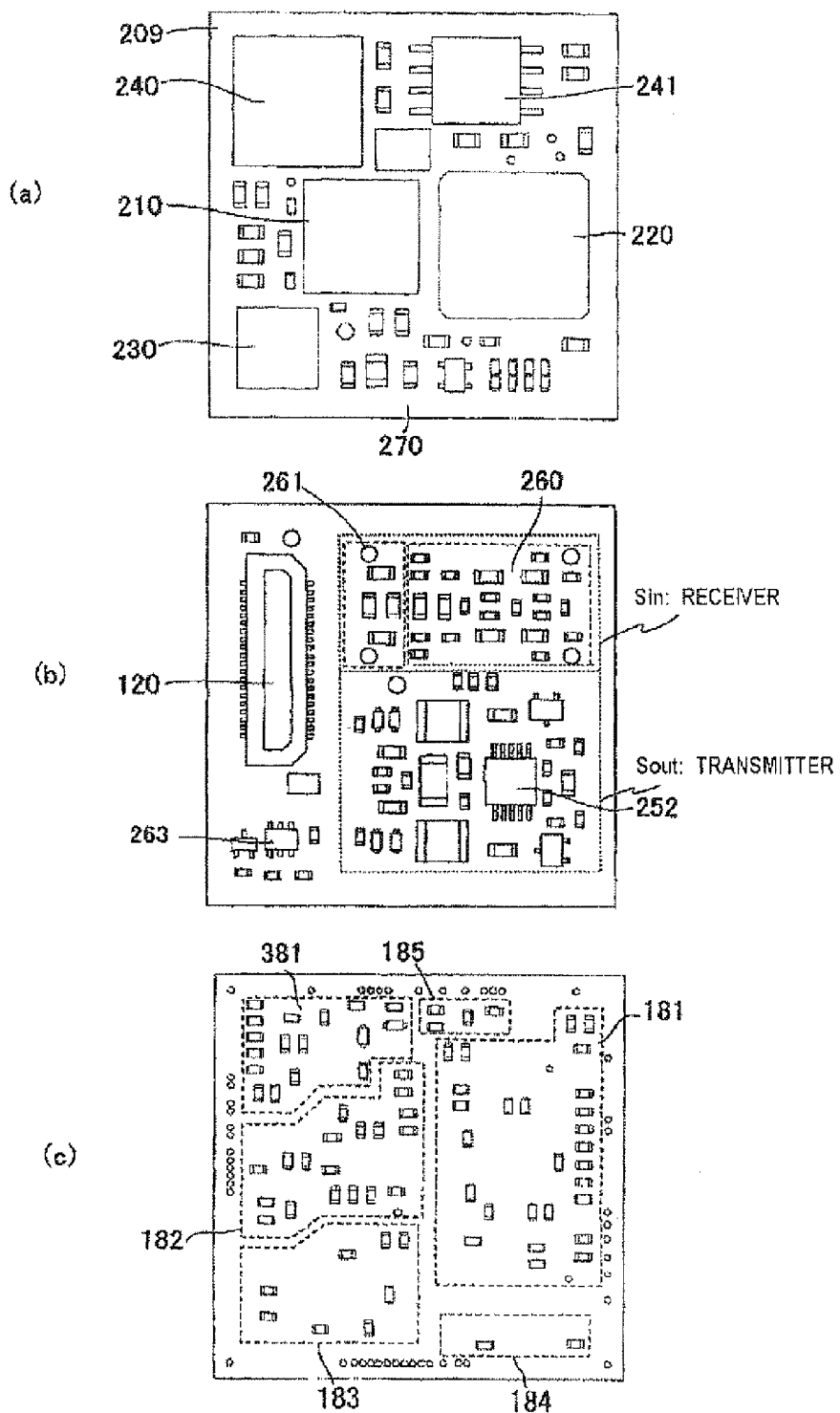
FIG. 5 shows the upper face, the lower face, and built-in components of the electronic circuit board forming the PLC circuit module of Embodiment 1.

FIGS. 3 to 5 show the circuit module 200. FIG. 3 is a sectional view of the circuit module 200, FIG. 4 is a schematic representation to show planar placement of digital components and the operational amplifier of a heating component, and FIG. 5 shows component placement of each face of the circuit module 200. In FIG. 5, (a) is a plan view to show the first face 200a of the digital component installation face; in FIG. 5, (b) is a plan view to show the second face 200b of the digital component installation face; and in FIG. 5, (c) is a plan view to show the built-in components. That is, in Embodiment 1, the first stack board 10 on which digital components such as the Ethernet (registered trademark) PHY IC 230, the PLC IC 210, and the AFE IC 220 of integrated circuits for performing modulation and demodulation processing of a digital signal and any other processing of a digital signal, memory (SDRAM) 240, memory (flash ROM) 241, and a reset IC 270 is fixed to the second stack board 30 through the composite sheet as an insulating sheet as (a) in FIG. 5 shows the first face 200a of a digital component installation face. First to fourth metal layers 12 to 15 are stacked on and fixed to the first stack board 10 of the two stack boards through an insulating layer 17. Numerals 11 and 16 are wiring patterns forming wiring on the surface and the back of the stack board. The wiring patterns are also formed like the first to fourth metal layers; here, they are assumed to be connection pad, and the nearest layer is the first metal layer 12. First to fourth metal layers 32 to 35 each forming a wiring pattern are stacked on and fixed to the second stack board 30 through an insulating layer 37. Numerals 31 and 36 are wiring patterns forming wiring on the surface and the back of the stack board. The wiring patterns are also formed like the first to fourth metal layers; here, they are assumed to be connection pad. The second stack board 30 is also formed like the first stack board 10. As shown in FIG. 4 and by (c) in FIG. 5, heating components of the interface connector (connector) 120, the balanced filters 260, the operational amplifier 252, etc., are installed on the second face 200b of the second stack board 30. By (b) in FIG. 5, a logic IC 263 is an integrated circuit for controlling operation of a display section described later. An attenuator 261 decreases a reception signal and absorbs load fluctuation of a PLC reception signal.

In FIG. 5, (c) shows electronic components built into the composite sheet and they are all mounted on the first stack board. By (c) in FIG. 5, numeral 181 denotes a built-in component connected to the AFE IC 220. Numeral 182 denotes a built-in component connected to the PLC IC 210. Numeral 183 denotes a built-in component connected to the memory (SDRAM) 240. Numeral 184 denotes a built-in component connected to the memory (flash ROM). Numeral 185 denotes a built-in component connected to the reset IC. Numeral 381 denotes a built-in component connected to the Ethernet (registered trademark) PHY IC 230.

The connector 120 and the operational amplifier 252 are placed in the proximity of an end part of the second face 200b. The connector 120 and the operational amplifier 252 are placed at positions along the diagonal line of the second face 200b.

In recent years, there has been tendency to demand still more miniaturization of the power line communication apparatus. As one means for miniaturizing the PLC modem 100, it is considered that the mounting density of the built-in components (boards, electronic components, etc.,) in the housing 101 is made high. If the mounting density of the built-in components in the housing 101 is made high, the space formed between the circuit module 200 and the mother board 100 in FIG. 2 becomes narrow. If the space becomes narrow, the radiation area that the space has also becomes small as a matter of course and thus the radiation efficiency of the circuit module 200 lowers. Therefore, heat emitted from the analog components mounted on the second face 200b and heat generated from the electronic components mounted on the mother board 100 are not efficiently radiated from the space and the temperature of the circuit module 200 is easily raised.

It is desirable that components with a large heating value (for example, the operational amplifier 252) of the analog components mounted on the second face 200b should be placed in the proximity of an end part of the second face 200b. If the operational amplifier 252 with a large heating value is placed in the proximity of the end part of the second face 200b, the operational amplifier 252 is exposed to outside air at a low temperature, so that heat of the operational amplifier 252 can be efficiently radiated because of heat convection with the outside air. Thus, heat of the analog component with a large heating value is efficiently radiated because of heat convection with the outside air, it is made possible to suppress a temperature rise of the circuit module 200.

If the connector 120 is formed of a material having low heat resistance such as resin, it is desirable that the connector 120 should be formed in the proximity of one end of the second face 200b and the operational amplifier 252 should be placed in the proximity of another end of the second face 200b. The connector 120 and the operational amplifier 252 are thus placed, whereby the distance between the connector 120 and the operational amplifier 252 can be made large and it is made possible to decrease the effect of heat generated from the operational amplifier 252, received by the connector 120.

If the connector 120 is formed of a material having low heat resistance such as resin, it is also effective that the connector 120 and the operational amplifier 252 are placed on a diagonal line of the second face 200b. The connector 120 and the operational amplifier 252 are placed on the diagonal line, whereby the distance between the connector 120 and the operational amplifier 252 can be made large and it is made possible to decrease the effect of heat generated from the operational amplifier 252, received by the connector 120. Placement of the connector 120 and the operational amplifier 252 is not limited to placement on the diagonal line of the second face 200b. The connector 120 and the operational amplifier 252 may be placed on a line parallel to a line crossing one side of the second face 200b at an acute angle.

If the connector 120 is formed of a material having high heat resistance, preferably the connector 120 is placed in the proximity of the end part of the second face 200b and the operational amplifier 252 is placed in the proximity of the connector 120. If the connector 120 is formed of a material having high heat resistance, the connector 120 can radiate heat generated from the operational amplifier 252 conducted through the circuit module 200.

The connector 120 and the operational amplifier 252 are placed so as to maintain a predetermined distance. The circuit configuration of the PLC circuit module 200 containing the PLC IC 210 is described later.

Thus, the PLC circuit module 200 housed in the PLC modem 100 includes the first and second stack boards. In the electronic circuit board including the first and second stack boards, the first stack board 10 with the Ethernet (registered trademark) PHY IC 230 installed on the first face 200a and the second stack board 30 with a low-pass filter 251 of a balanced filter, the balanced filters (band-pass filters) 260, and the AFE IC 220 installed on the surface are fixed and stacked through the insulating sheet 20. The first stack board 10 contains the wiring layers 11 and 16 containing a pad on the surface and the back and metal layers 12, 13, 14, and 15 stacked through the insulating layer 17. The first metal layer 12 as a ground layer is disposed at a position near to the Ethernet (registered trademark) PHY IC 230 on the back of the four metal layers and is connected to pad B of the wiring pattern 11 and the PLC IC 210 through a via hole H1.

Thus, the first and second stack boards 10 and 30 are used as the electronic circuit board forming the PLC circuit module 200. That is, the first stack board 10 on which the PLC IC 210 of the integrated circuit for modulating and demodulating a multicarrier signal is fixed to the second stack board 30 through the composite sheet 20 as the insulating sheet. Stacked metal layers 32 to 35 are stacked on and fixed to the second stack board 30 through an insulating layer 37. The second stack board 30 is also formed with metal layers 31 and 36 forming connection pads on the surface and the back (see FIG. 3).

In the configuration, the digital components are mounted on the first face, the balanced filters are mounted on the second face opposed to the first face, and the second face is opposed to the mount board. Thus, the balanced filters can circumvent the effect of noise from the digital components, noise can be decreased, and the highly reliable electronic circuit can be provided. An electromagnetic field distribution is described later.

In the circuit module described above, the digital components such as the Ethernet (registered trademark) PHY IC 230, the PLC IC 210, and the AFE IC 220 of integrated circuits for performing modulation and demodulation processing of a digital signal and any other processing of a digital signal, the memory 240, and the reset IC 270 are mounted on the first face 200a of the first stack board 10. The balanced filters 260, the operational amplifier 252, and the like for processing an analog signal are mounted on the second face 200b of the second stack board 30. Therefore, the analog components and the digital components do not mix on the first face 200a and the second face 200b and the analog components mounted to be isolated from the digital components. Further, the first stack board 10 and the second stack board 30 are stacked through the composite sheet 20, so that the distance between the analog components and the digital components becomes large as much as the thickness of the composite sheet 20. The strength of noise occurring from the digital components lessens as at a distance from the digital components of the noise source. Therefore, in the circuit module 200, the analog components are larger isolated from the digital components as much as the thickness of the composite sheet 20, so that the effect of noise generated from the digital components, received by the analog components lessens.

In FIG. 3, the circuit module 200 is provided with a via hole H2 piercing the first stack board 10, and the PLC IC 210 and the built-in electronic component 182 (for example, resistance element) are electrically connected through the via hole H2.

According to the configuration, if a mismatch of impedance between the characteristic impedance of a conducting path provided in the via hole H2 and the built-in electronic component and unnecessary radiation from the built-in electronic component and the conducting path, the built-in electronic component 182 and the conducting path are confined in the circuit module 200 and the unnecessary radiation can be shielded by the conductor layers 11 to 16 and 31 to 36 in the circuit module 200. Therefore, it is made possible to decrease the unnecessary radiation affecting the operation of the analog components mounted on the second face 200b.

The distance between a bonding pad (not shown) of a ground terminal of the PLC IC 210 and the first metal layer 12 forming a ground layer becomes the shortest, the ground terminal and the ground layer can be connected by the shallow inner via H1 piercing only the insulating layer 17 of the surface without forming a via piercing the stack board, and while working accuracy is maintained, the ground terminal and the ground layer can be connected. Consequently, if the number of ground terminal pins is large, lowering of the mount area of the back of the stack board, namely, the face where the integrated circuits are not mounted because of a piercing via does not occur. An increase in inductance caused by an increase in the distance in the thickness direction of the stack board can also be minimized.

The first metal layer 12 forming the ground layer of the first stack board 10 is formed by patterning copper foil so as to have an occupation area of 80% or more of the board face. The second metal layer 13 forming a power supply layer formed by patterning copper foil is formed on the upper layer side of the first metal layer 12 (the side at a distance from the modulation and demodulation IC (PLC IC) 210). The second metal layer 13 is connected to a power terminal (not shown) of the PLC IC 210, the memory 240, etc., via the inner via.

In the first and second stack boards 10 and 30, the insulating layers 17 and 37 and the wiring patterns 11, 16, 31, and 36 for sandwiching the metal layers 12, 13, 14, 15, 32, 33, 34, and 35 forming patters of ground layer, power supply layer, wiring layer, etc., between the insulating layers 17 and 37 and forming a connection pad on the surface and the back are disposed and they are electrically connected by a via hole formed in the insulating layer 17. The via hole can be formed by laser beam machining or drilling or with a mold, for example. The laser beam machining can form a through hole at fine pitches and does not produce shavings and thus preferred. In the laser beam machining, if carbon dioxide gas laser or excimer laser is used, working is easy to perform. As a method of electric connection, electroless plating may be used to form or conductive substance may be filled to form.

The metal layers 11, 12, 13, 14, 15, and 16 (31, 32, 33, 34, 35, and 36) forming the wiring patterns, the ground layer, and the power supply layer are formed of copper foil; they may be formed of substance having electrical conductivity such as a conductive resin composition. For example, to use copper foil as a wiring pattern, for example, copper foil having a thickness of about 12 μm to 35 μm manufactured by electrolytic plating can be applied. To improve the adhesive property to the insulating layers 17 and 37, it is desirable that the face of copper foil coming in contact with the insulating layers 17 and 37 should be made rough. To improve the adhesive property and oxidation resistance, copper foil whose surface undergoes coupling treatment and is plated with tin, zinc, or nickel can also be used. As the metal layer, a lead frame of a metal plate formed by an etching method or a punching method. To use the lead frame, it can be formed as follows: A green sheet is formed for each unit by a print method, etc., on the lead frame and is fixed and then components are mounted as required and layers are stacked in order in such a manner that an insulating layer of the next layer is stacked and further a metal layer of the next layer . . . and last, dividing to a stack board forming the unit is executed.

The composite sheet as the insulating sheet 20 for fixing the first and second stack boards 10 and 30 of the invention is formed of a mixture containing an inorganic filler and thermosetting resin and is called green sheet. The sheet is stacked in a state in which hole drilling for circuit components and the conducting path is performed as required in an uncured state and is dried and hardened at about 200° C., whereby the sheet is stacked in a state in which it contains the circuit components and the conducting path. The holes for the circuit components and the conducting path can be formed by laser beam machining or drilling or with a mold, for example. The laser beam machining can form a through hole at fine pitches and does not produce shavings and thus preferred. In the laser beam machining, if carbon dioxide gas laser or excimer laser is used, working is easy to perform. When a mixture is molded to form the green sheet, the holes may be formed at the same time. For example, $Al_2O_3$, MgO, BN, AlN, $SiO_2$, or the like can be used as the inorganic filler. Preferably, the inorganic filler is 70% by weight to 95% by weight relative to the mixture. Preferably, the mean particle size of the inorganic filler is 0.1 μm to 100 μm or less. Preferably, for example, epoxy resin, phenol resin, or cyanate having high heat resistance is used as the thermosetting resin. The epoxy resin having particularly high heat resistance is particularly preferred. The mixture may further contain a dispersing agent, a coloring agent, a coupling agent, or a mold release agent.

Since the mixture of the inorganic filler and the thermosetting resin is used as the material of the insulating sheet 20, it is not necessary to fire at high temperature unlike a ceramic board and the sheet is formed by drying at about 200° C. and thus is easily manufactured.

An inorganic filler used for the insulating sheet 20 is selected, whereby the coefficient of linear expansion, the heat conductivity, the dielectric constant, etc., of the insulating sheet 20 can be easily controlled. If the coefficient of linear expansion of the insulating sheet 20 is made almost equal to that of a semiconductor element, occurrence of crack, etc., caused by a temperature change can be prevented and the highly reliable electronic circuit board can be formed. If the heat conductivity of the insulating sheet 20 is improved, when circuit components are installed at a high density, the highly reliable electronic circuit board can be obtained.

The plate insulation sheet 20 may be subjected to heat treatment at a lower temperature than the setting temperature of thermosetting resin. The plate insulation sheet 20 is subjected to heat treatment, whereby while flexibility of the insulating sheet 20 is maintained, adherence cam be removed and thus later treatment becomes easy to perform. A mixture with thermosetting resin dissolved with a solvent is subjected to heat treatment, whereby a part of the solvent can be removed.

A conducting path P formed in the insulating sheet 20 is formed of a thermosetting conductive substance, for example. For example, a conductive resin composition provided by mixing metal particles and thermosetting resin can be used as the thermosetting conductive substance. Gold, silver, copper, nickel, or the like can be used as the metal particles. Gold, silver, copper, or nickel has high conductivity and thus is preferred as conductive substance; copper has high conductivity and small migration and thus is particularly preferred. For example, epoxy resin, phenol resin, or cyanate can be used as the thermosetting resin. The epoxy resin has high heat resistance and thus is particularly preferred.

A circuit component 18 contained in the insulating sheet 20 may be an active component or may be a passive component. For example, a semiconductor element such as a transistor, an IC, or an LSI is used as the active component. The semiconductor element may be a semiconductor bare chip or may be a semiconductor element sealed with a resin. A chip-like resistor, a chip-like capacitor, a chip-like inductor, or the like is used as the passive component. Circuit components containing no passive component can also be applied.

The insulating sheet 20 is used, whereby the contained circuit component 18 can be shielded from outside air, so that reliability degradation caused by a humidity can be prevented.

Figure 6:
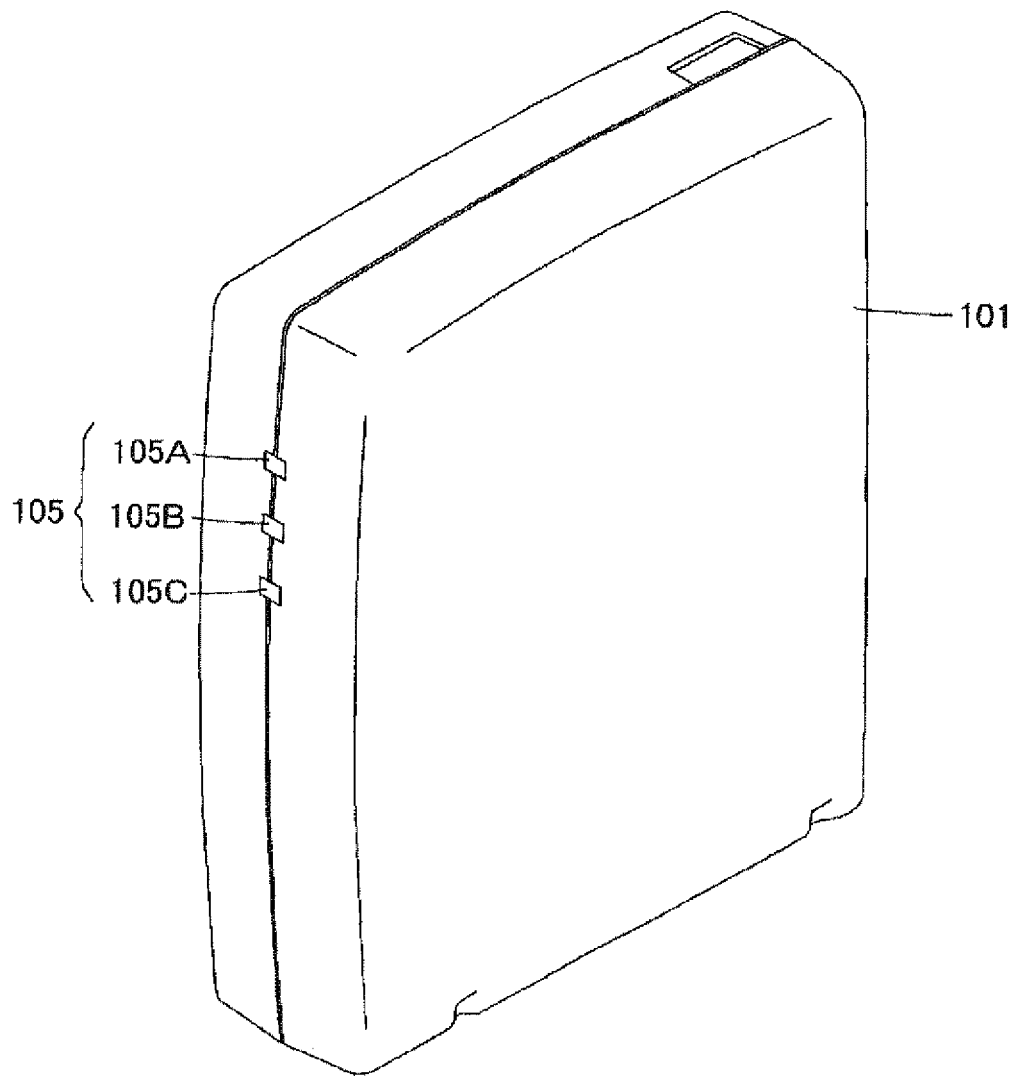
FIG. 6 shows the appearance of a PLC modem of Embodiment 1.

The PLC modem using the first stack board (and the second stack board) as the electronic circuit board as the high-speed power line communications (PLC) module will be described below in detail: FIG. 6 is an external perspective view to show the front of the PLC modem.

The PLC modem has a housing 101 and a display section 105 including LEDs (Light Emitting Diodes) 105A, 105B, and 1050 is provided on the front of the housing 101. A power supply connector (not shown), a LAN (Local Area Network) modular jack of RJ45, etc., (not shown), and a changeover switch 106 for switching an operation mode, etc., are provided on the rear of the housing 101. A power cable (not shown in FIG. 1) is connected to the power supply connector, and a LAN cable (not shown in FIG. 1) is connected to the modular jack. The PLC modem may be further provided with a Dsub (D-subminiature) connector and a Dsub cable may be connected. Any other known connector, etc., may be provided, needless to say. As the display section, in addition to a plurality of LEDs, the color of one LED may be changed or the communication speed, etc., may be displayed on a liquid crystal display, an EL display, etc. FIG. 5 shows a configuration example of the PLC modem as a power line communication apparatus; the PLC modem can also be applied to an electric device (household electric device such as a TV, for example) including the PLC modem.

Figure 7:
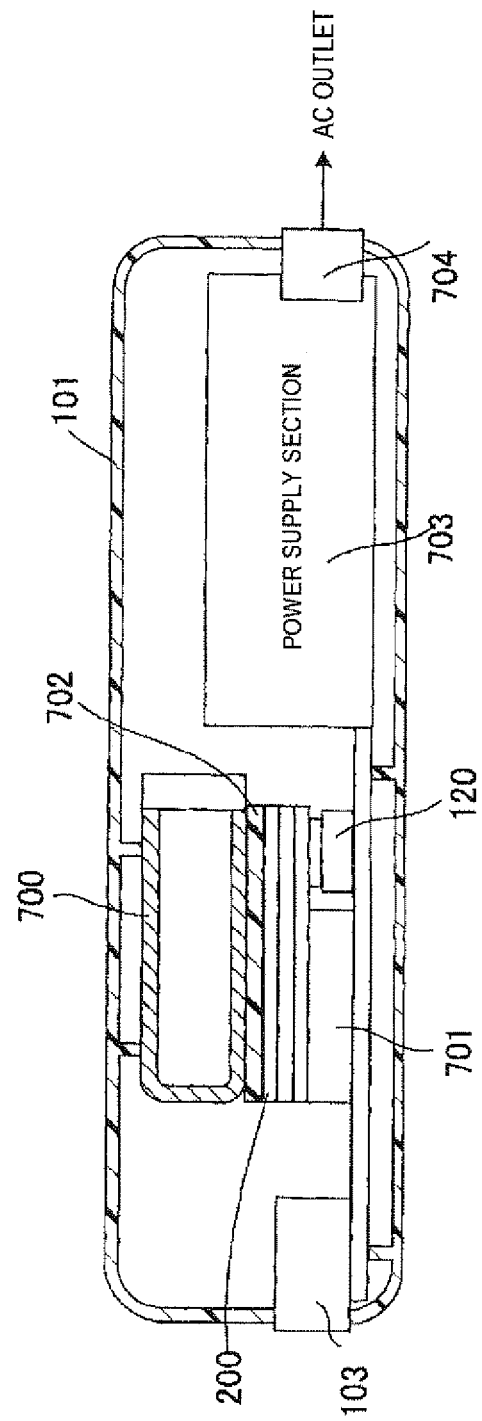
FIG. 7 is a sectional view of the PLC modem of Embodiment 1.

FIG. 7 is a schematic representation to show the inside of the housing of the PLC modem. In the PLC modem, the PLC circuit module 200 is installed on the mother board 110 through the connector 120 in the housing 101. On the upper face of the PLC module, a radiator plate 700 is abutted against an inner wall of the housing 101 through an elastic body 702 made of thermal-conductivity rubber. Numeral 103 denotes an RJ45 connector (Ethernet (registered trademark)) and network connection is made through this connector. Numeral 701 denotes a cover, numeral 703 denotes a power supply section, and numeral 704 denotes a power supply connector.

Figure 8:
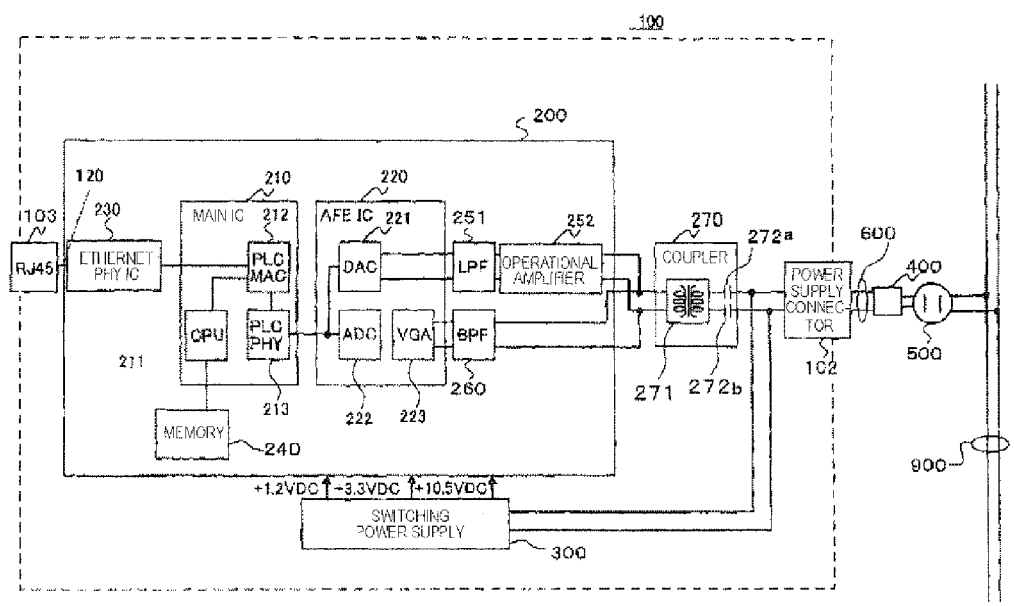
FIG. 8 is a block diagram to show an example of hardware of the PLC modem of Embodiment 1.

FIG. 8 is a block diagram to show the configuration of the PLC modem. The PLC circuit module 200 is provided with the main IC (Integrated Circuit) 210 as the modulation and demodulation IC (PLC IC), the AFE IC (Analog Front End IC) 220, the memory 240, the low-pass filter 251, the operational amplifier 252, and the balanced filters 260. A switching power supply 300 and a coupler 270 are connected to a power supply connector 102 and further are connected to a power line 900 through a power cable 600, a power supply plug 400, and an outlet 500.

The PLC IC 210 is made up of a CPU (Central Processing Unit) 211, a PLC MAC (Power Line Communication Media Access Control layer) block 212, and PLC PHY (Power Line Communication Physic layer) block 213. A 32-bit RISC (Reduced Instruction Set Computer) processor mounted on the CPU 211. The PLC MAC block 212 manages a MAC layer and the PLC PHY block 213 manages a PHY layer of transmission and reception signals. The AFE IC 220 is made up of a D/A converter (DAC) 221, an A/D converter (ADC) 222, and a variable amplifier (VGA) 223. The coupler 270 is made up of a coil transformer 271 and coupling capacitors 272a and 272b. The CPU 211 uses data stored in the memory 240 to control the operation of the PLC MAC block 212 and the PLC PHY block 213 and also control the whole PLC modem 100.

The PLC modem 100 executes transmission using a plurality of subcarriers of OFDM system, etc., and digital signal processing for executing such transmission is performed in the PLC IC 210, particularly the PLC PHY block 213.

Figure 9:
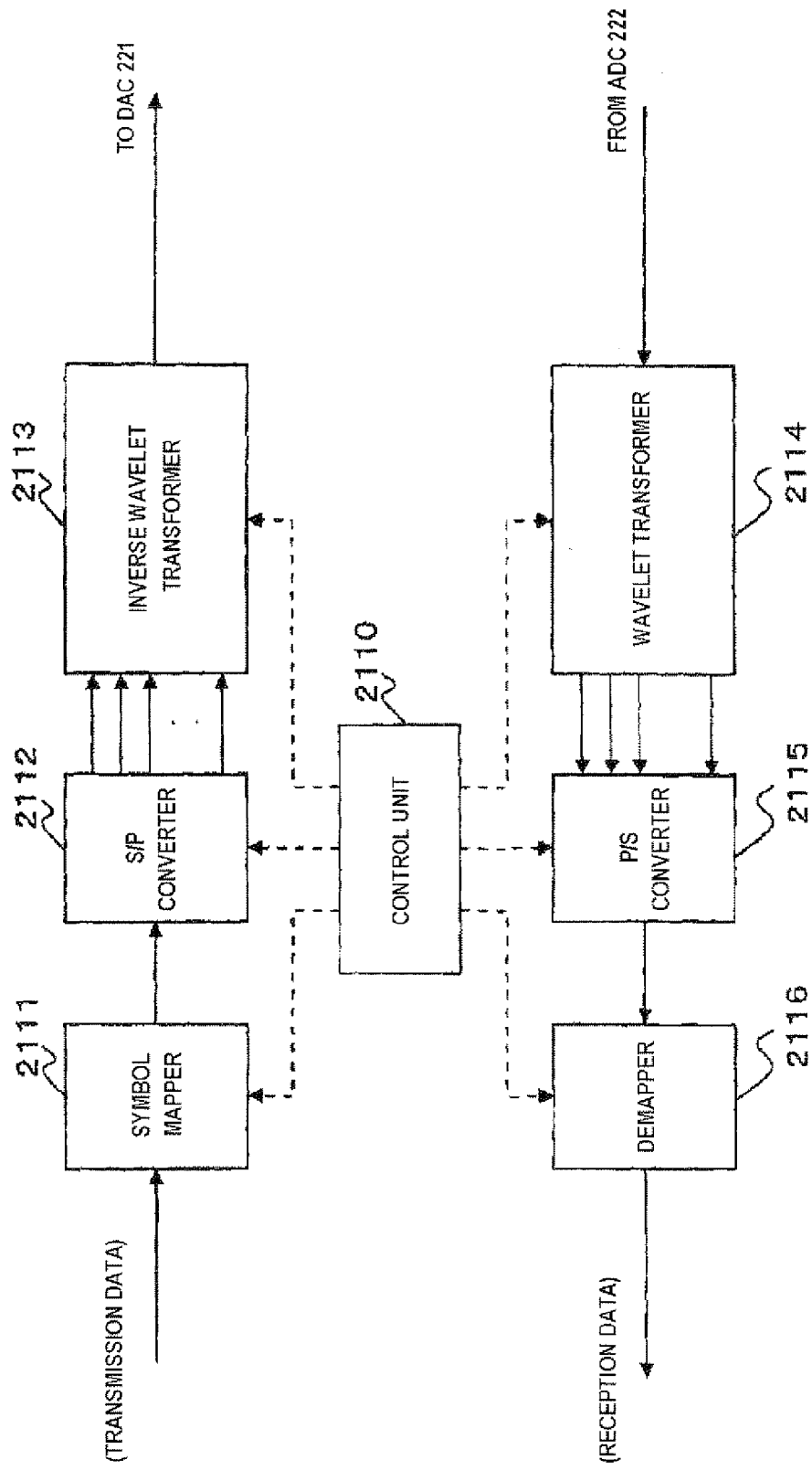
FIG. 9 is a schematic function block diagram of an example of a digital signal processing section realized by a PLC IC 210 of PLC module of Embodiment 1.

FIG. 9 is a schematic function block diagram of an example of a digital signal processing section realized by the PLC IC 210; OFDM transmission using wavelet transform is executed. The digital signal processing section in FIG. 9 includes a control unit 2110, a symbol mapper 2111, a serial-parallel converter (S/P converter) 2112, an inverse wavelet transformer 2113, a wavelet transformer 2114, a parallel-serial converter (P/S converter) 2115, and a demapper 2116.

The symbol mapper 2111 converts bit data to be transmitted into symbol data and performs symbol mapping (for example, PAM modulation) according to the symbol data. The S/P converter 2112 converts mapped serial data into parallel data. The inverse wavelet transformer 2113 performs inverse wavelet transform of parallel data to provide data on a time axis and generates a sample value series representing a transmission symbol. The data is sent to the D/A converter (DAC) 221 of the AFE IC 220.

The wavelet transformer 2114 performs discrete wavelet transform of reception digital data obtained from the A/D converter (ADC) 222 of the AFE IC 220 (sample value series sampled at the same sample rate as that at transmission time) onto a frequency axis. The P/S converter 2115 converts parallel data on the frequency axis into series data. The demapper 2116 calculates the amplitude value of each subcarrier, determines a reception signal, and finds reception data.

Communications of the PLC modem 100 are roughly conducted as follows: When data input from the RJ45 connector 103 is received, the data is sent to the PLC IC 210 through the Ethernet (registered trademark) PHY IC 230 and is subjected to digital signal processing to generate a digital transmission signal. The digital transmission signal is converted into an analog signal by the D/A converter (DAC) 221 of the AFE IC 220 and the analog signal is output to the power line 900 through the low-pass filter 251, the operational amplifier (driver IC) 252, the coupler 270, the power supply connector 102, the power cable 600, the power supply plug 400, and the outlet 500.

When a signal is received from the power line 900, the signal is sent to the band-pass filters 260 of the balanced filters via the coupler 270 and is subjected to gain adjustment in the variable amplifier (VGA) 223 and then is converted into a digital signal in the A/D converter (ADC) 222. Then, the signal is sent to the PLC IC 210 and is subjected to digital signal processing and is converted into digital data. The digital data is output from the RJ45 connector through the Ethernet (registered trademark) PHY IC 230.

Figure 10:
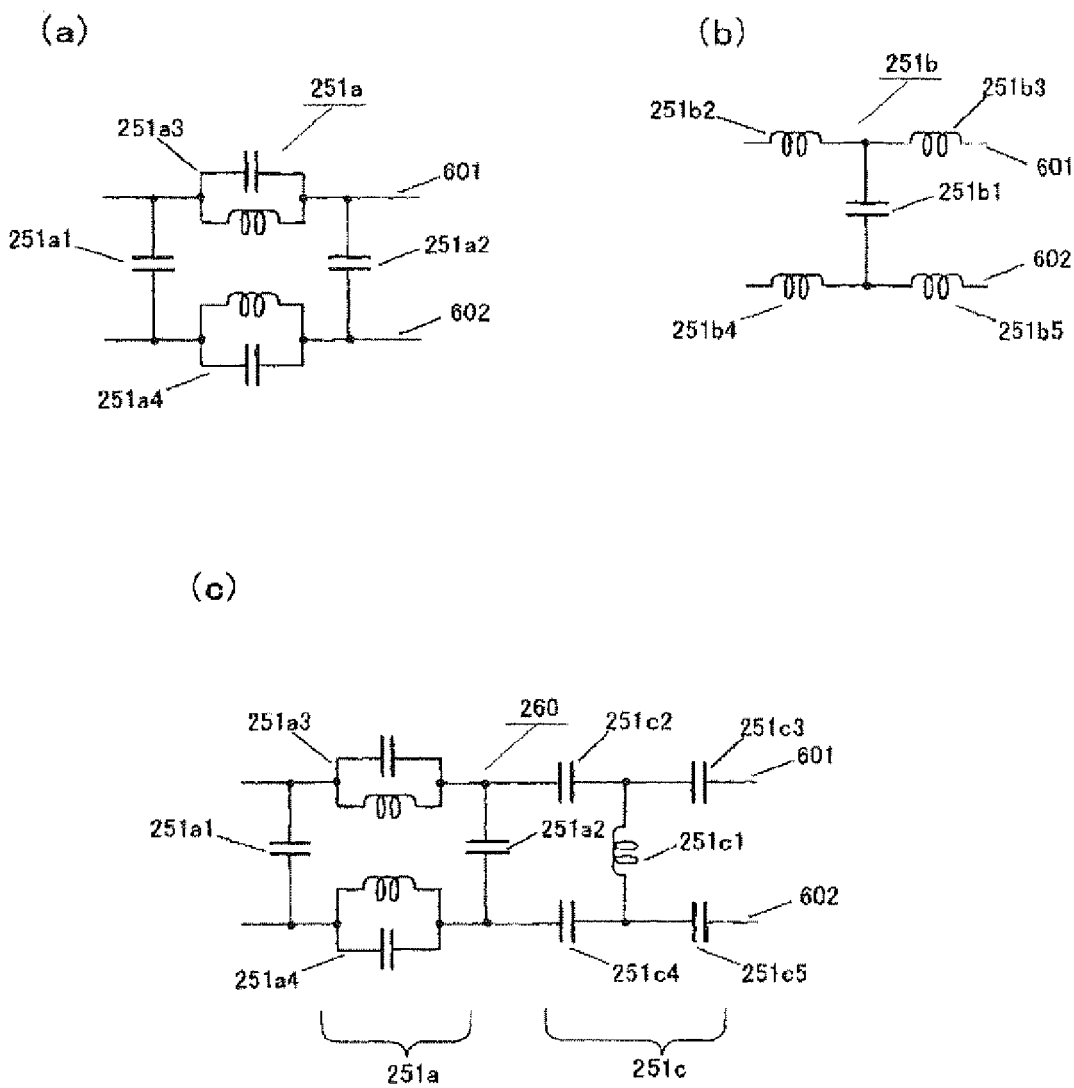
FIG. 10 is equivalent circuit diagrams to show balanced filters used with the PLC circuit module of Embodiment 1.
Figure 11:
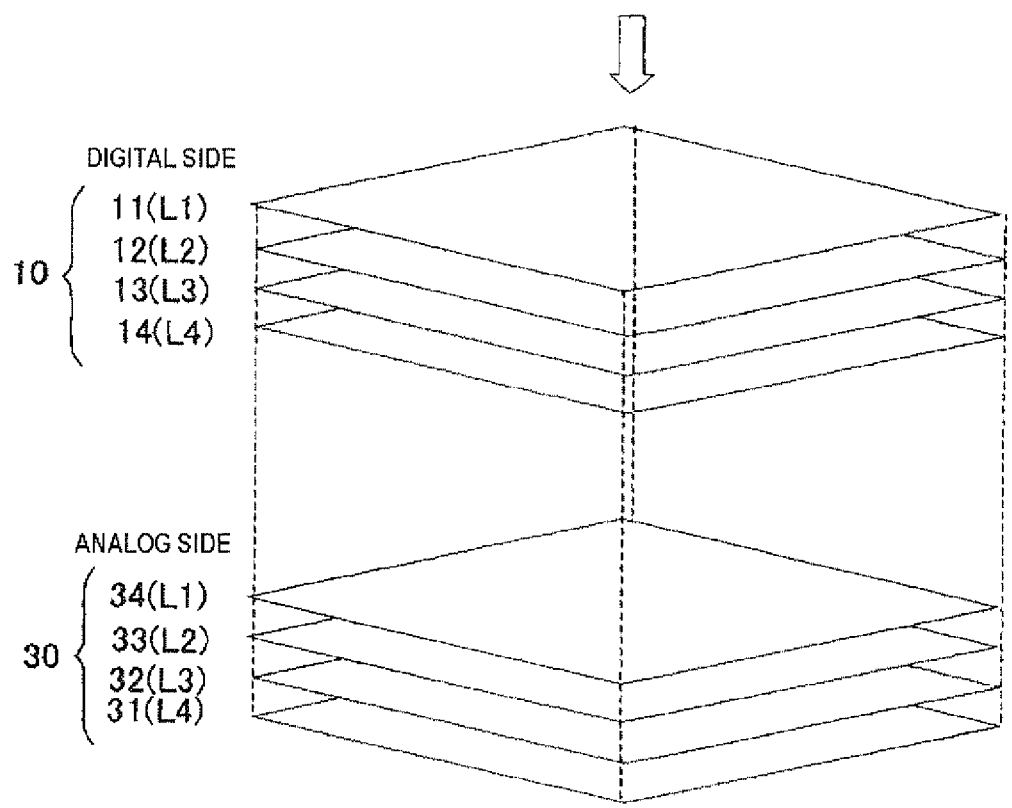
FIG. 11 shows the configuration of a second stack board used with the PLC circuit module of Embodiment 1.

The low-pass filter 251 placed on the transmission side is made up of a large number of capacitors and coils as an equivalent circuit of the low-pass filter is shown by (a) or (b) in FIG. 10. The band-pass filter 260 placed on the reception side is also made up of a large number of capacitors and coils as an equivalent circuit of the band-pass filter is shown by (c) in FIG. 10. A low-pass filter 251a shown by (a) in FIG. 10 (a) has two capacitors 251a1 and 251a2 connected between paired lines 601 and 602. CL parallel circuits 251a3 and 251a4 are connected to the paired lines 601 and 602 in series so as to be sandwiched between the two capacitors 251a1 and 251a2. A low-pass filter 251b shown by (b) in FIG. 10 is connected between the paired lines 601 and 602 and has one capacitor 251b1. Two inductors 251b2 and 251b3 are connected to the line 601 in series so as to sandwich the capacitor 251b1. Two inductors 251b4 and 251b5 are connected to the line 602 in series so as to sandwich the capacitor 251b1.

The lines 601 and 602 are connected to the power line 900 having a pair of lines through the power cable 600 shown in FIG. 8. If circuit constants of the CL parallel circuits 251a3 and 251a4 are the same, impedances of the low-pass filter 251a shown by (a) in FIG. 10 viewed from the pair of lines of the power line 900 are the same. Therefore, the low-pass filter 251a forms a balanced filter. If circuit constants of the inductors 251b2 and 251b3 and the inductors 251b4 and 251b5 are the same, impedances of the low-pass filter 251b shown by (b) in FIG. 10 viewed from the pair of lines of the power line 900 are the same. Therefore, the low-pass filter 251b forms a balanced filter like the low-pass filter 251a. In so doing, the pair of lines of the power line 900 can be balanced, so that noise transmitted through one line can cancel out noise transmitted through the other line and noise can be suppressed.

The band-pass filter 260 shown by (c) in FIG. 10 has the low-pass filter 251a shown by (a) in FIG. 10 and a high-pass filter 251c connected to the lines 601 and 602 in series. The high-pass filter 251c has one inductor 251c1 connected between the pair of lines 601 and 602. Two capacitors 251c2 and 251c3 are connected to the line 601 in series so as to sandwich the inductor 251c. Two capacitors 251c4 and 251c5 are connected to the line 602 in series so as to sandwich the inductor 251c1.

If circuit constants of the capacitors 251c2 and 251c3 and the capacitors 251c4 and 251c5 are the same, impedances of the band-pass filter 260 shown by (c) in FIG. 10 viewed from the pair of lines of the power line 900 are the same. Therefore, the band-pass filter 260 forms a balanced filter. In so doing, the pair of lines of the power line 900 can be balanced and the pair of lines of the power line 900 can be balanced, so that noise transmitted through one line can cancel out noise transmitted through the other line and noise can be suppressed.

The impedances of each filter shown in FIG. 10 viewed from the pair of lines of the power line 900 are the same, but need not completely be the same and may be roughly the same in the range in which the effect of suppressing noise is produced. For example, if the difference between the impedances viewed from the lines is ±5%, the effect of noise suppression can be produced.

The PLC circuit module 200 has the first stack board 10 and the second stack board 30 stacked through the composite sheet 20 as described above. The first stack board 10 contains the four layers of the metal layers 11, 12, 13, and 14 as inner layers with comparatively small components installed on the surface and the PLC IC 210, the memory 240, etc., installed on the back as shown in FIG. 12. The second stack board 30 contains the four layers of the metal layers 31, 32, 33, and 34 as inner layers with comparatively small components installed on the back and the balanced filters 251 and 260 and the AFE IC 220 on the surface as shown in FIG. 12.

Next, a manufacturing method of the PCL circuit module 200 will be described.

Figure 13:
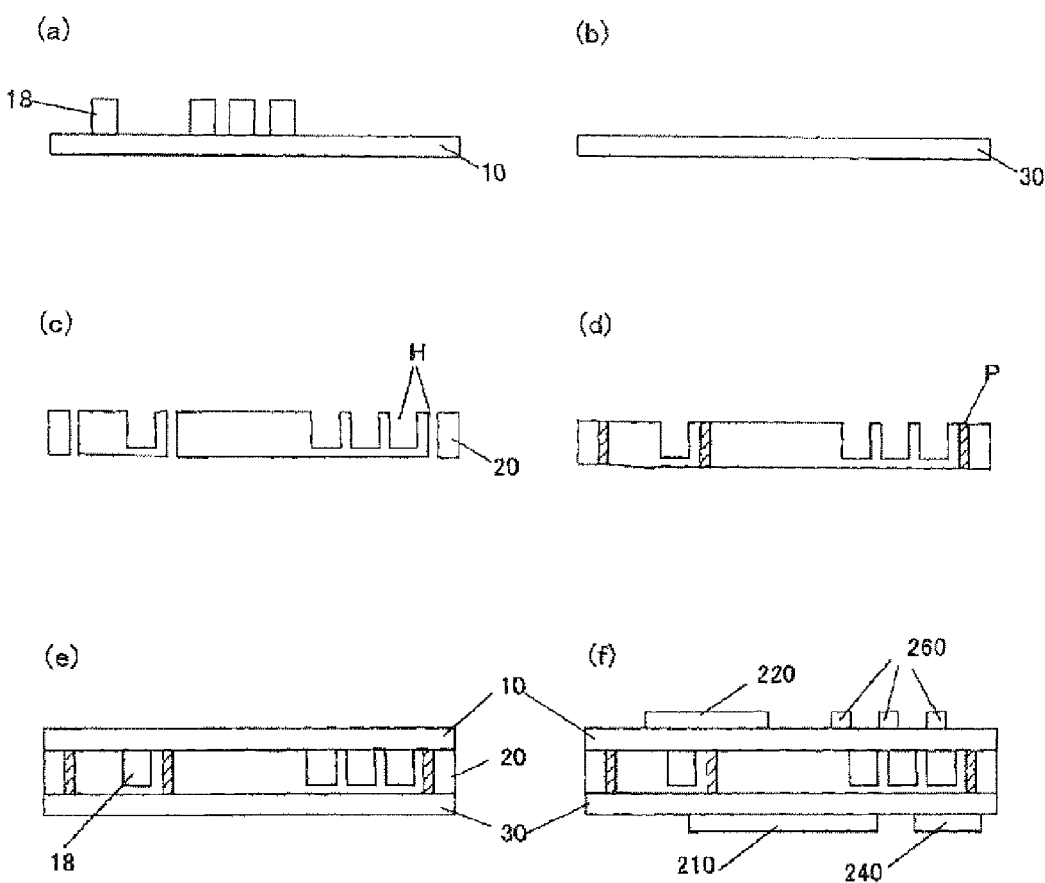
In FIG. 13, (a) to (f) are sectional views to show one embodiment of the manufacturing process of the PLC module of Embodiment 1.
Figure 14:
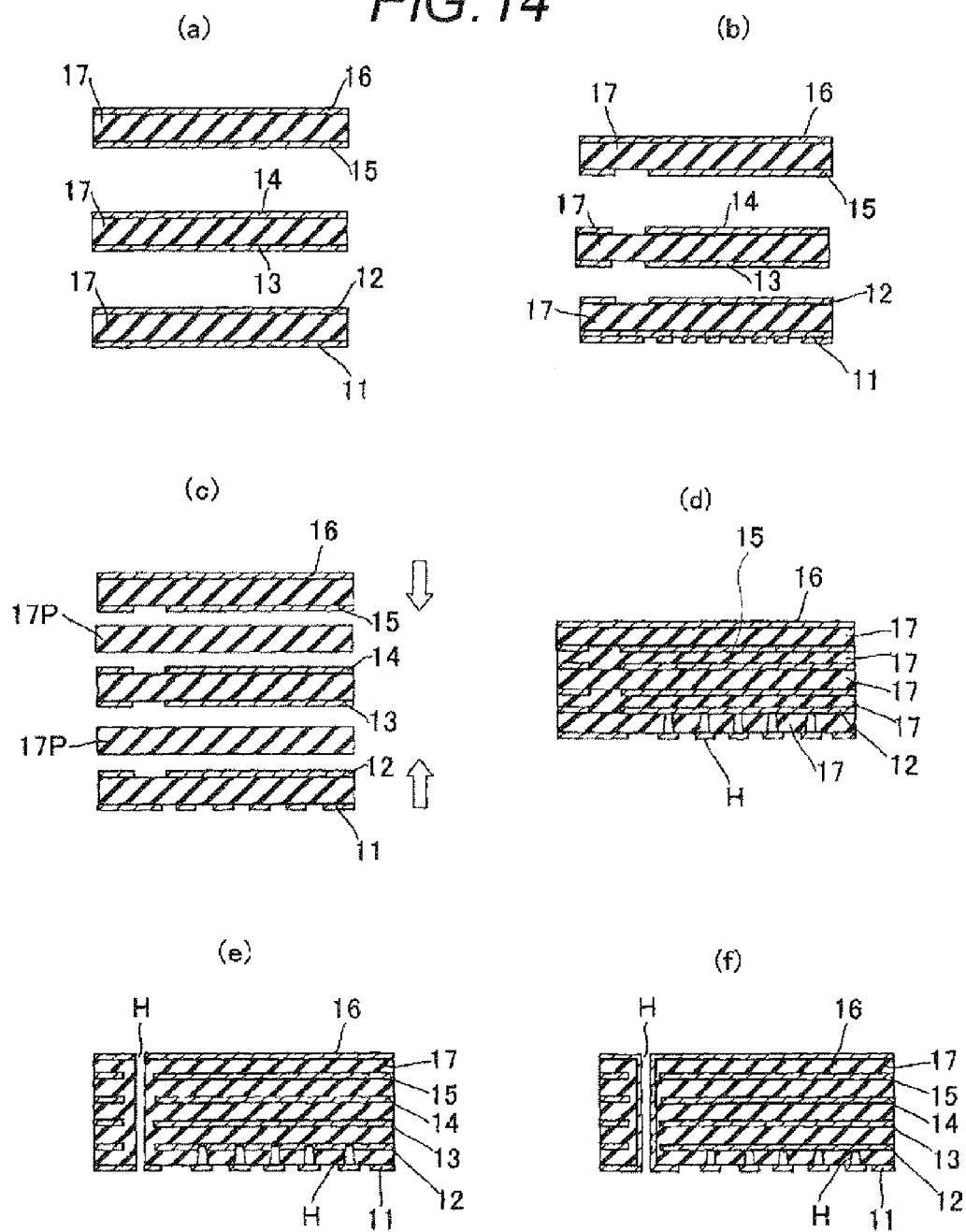
In FIG. 14, (a) to (f) are sectional views to show a manufacturing process of a first stack board used with the PLC module of Embodiment 1.

In FIG. 12, (a) to (f) are perspective views to show one embodiment of a manufacturing process of the PLC module. In FIG. 13, (a) to (f) are sectional views of (a) to (f) in FIG. 12. In FIG. 14, (a) to (f) are sectional views to show a manufacturing process of the first stack board as the electronic circuit board forming the PLC module.

First, before the description of the manufacturing process of the PLC module, the manufacturing process of the first stack board will be described.

First, as shown by (a) in FIG. 14, an uncured-state insulating layer 17 with thermosetting resin impregnated with woven cloth is formed and copper foil as the metal layers 11 and 12 is put on both faces of the insulating layer 17. Likewise, copper foil as the metal layers 13 and 14 is put on both faces of an insulating layer 17 and copper foil as the metal layers 15 and 16 is put on both faces of an insulating layer 17. While the double face board is heated, it is pressurized, whereby the resin of the insulating layer is cured, aramid nonwoven cloth, an inorganic filler, etc., may be used as the material of the insulating layer. Epoxy resin is used as the thermosetting resin, but phenol resin may be used.

Then, as shown by (b) in FIG. 14, each metal layer is patterned by photolithography to form a wiring pattern. Then, as shown by (c) in FIG. 14, while the insulating layers are heated across an insulating layer 17P called prepreg, they are pressed. They are registered, are put on each other, and pressurized, thereby forming a plate body. Then, the plate body is heated, whereby the thermosetting resin in the insulating layers 17 and 17P is cured and a stack body including six metal layers 11, 12, 13, 14, 15, and 16 is formed. Heating is performed at temperature equal to or more than temperature at which the thermosetting resin in the insulating layers 17 and 17P is cured (for example, 150° to 260° and the uncured insulation layer becomes the insulating layer 17. When the thermosetting resin in the insulating layers in uncured state is cured by heating, while it is heated, it is pressurized at pressure of 10 kg/cm$^2$ to 200 kg/cm$^2$, whereby the mechanical strength of the circuit component module can be improved.

Then, as shown by (d) in FIG. 14, a hole H to a ground layer 15 is formed using laser. The hole H can be formed by laser beam machining or drilling or with a mold as described above.

Then, as shown by (e) in FIG. 14, a through hole H piercing the stack substrate 10 is formed.

Further, as shown by (f) in FIG. 14, plating is performed in the through hole H and the metal layer which becomes a pad, a ground layer 15, and the like are electrically connected. Here, a conductive resin composition may be filled. The first stack substrate is thus formed.

In the embodiment, the wiring patterns 11 and 16 which become the outermost layers are also patterned and then are stacked and last the through hole H is formed and plating is performed in the through hole. The through hole and the wiring pattern 11 can be connected by forming a plate layer on the wiring pattern 16 which becomes a pad from the inside of the through hole by again performing selective plating. If copper foil is last put on the outermost layer and patterning is performed, a pad can also be formed on the through hole.

Likewise, the second stack board 30 is formed. The second stack board 30 differs from the first stack board in installed circuit components, but is formed through a process similar to that of the first stack board.

Next, to mount components on the PLC module, first, as shown by (a) in FIG. 12 and (a) in FIG. 13, circuit components 18 are mounted on the upper face of the first stack board 10.

Next, as shown by (b) in FIG. 12 and (b) in FIG. 13, the second stack board 30 is provided.

Then, as shown by (c) in FIG. 12 and (c) in FIG. 13, a composite sheet 20 is formed and a through hole H for components and to form a via (conducting path) is formed. As the composite sheet 20, a mixture containing an inorganic filler and thermosetting resin is molded, thereby forming a plate composite sheet. The plate composite sheet 20 is obtained by mixing an inorganic filler and thermosetting resin in an uncured state to form a past-like mixture and molding the past-like mixture in a given thickness. A through hole H to form a via (conducting path) is formed at any desired position of the plate composite sheet 20, thereby forming a plate body formed with the through hole. The through hole H can be formed by laser beam machining or drilling or with a mold, for example. When the past-like mixture is molded and the plate composite sheet 20 is formed, the through hole H may be formed at the same time.

As shown by (d) in FIG. 12 and (d) in FIG. 13, a conductive resin composition is filled into the through hole H of the composite sheet to form a conducting path P.

As shown by (e) in FIG. 12 and (e) in FIG. 13, the first board and the second board are registered through the composite sheet 20, are put on each other, and are pressurized, thereby forming a plate body in which the circuit components are buried. Then, the plate body is heated, thereby curing the thermosetting resin in the insulating sheet 20 and the conductive resin composition and forming a stack body with the circuit components 18 buried between the first stack body 10 and the second stack body 30. Heating is performed at temperature equal to or more than temperature at which the thermosetting resin in the composite sheet 20 and the conductive resin composition is cured (for example, 150° to 260° and the uncured composite sheet is cured. When the composite sheet in an uncured state is cured by heating, while it is heated, it is pressurized at pressure of 10 kg/cm$^2$ to 200 kg/cm$^2$, whereby the mechanical strength of the PLC circuit module can be improved.

Then, as shown by (f) in FIG. 12, PLC IC 210, memory 240, and the like are mounted on the lower face of the first stack board 10, AFEIC 220 and balanced filters 251 and 260 are mounted on the upper face of the second stack board 30, and the PLC module of the embodiment is complete.

The PLC module thus formed is housed in the housings 101a and 101b as shown in FIG. 6 and the PLC modem as shown in FIG. 5 is complete.

Thus, according to the PLC module of the embodiment, the digital components are mounted on the first face 200a, the analog components and the connection parts are mounted on the second face 200b opposed to the first face 200a, and the second face is opposed to the mount board, so that heat from the digital components is efficiently radiated from the first face of the board, the second face side is radiated to the second face side, and accumulation of heat in the electronic circuit board can be prevented.

The operation amplifier 252 of an analog component with a large heating value is placed most away from the connector 120 of the connection part, a temperature rise can be prevented efficiently.

Further, the rear side of the digital components mounted on the first face is abutted against a radiation member through an elastic member having good electric insulating property and heat conductivity, so that the radiation member plays a role in forcibly emitting heat. Thus, heat from the digital components is efficiently radiated from the whole of the first face of the board, heat does not flow into the second face, and the effect of heat can be shut out.

In addition, the modulation and demodulation ID and the balanced filters are not placed on the same face of the stack board, so that the effect of noise can be lessened and the small-sized and low-cost module having a good characteristic can be obtained.

A specific example will be described below:

An example of a manufacturing method of the electronic circuit board forming the PLC module will be described.

To produce a composite sheet body, first a pasted mixture mixed in any desired composition is dropped onto a mould releasing film in a predetermined amount. The pasted mixture was produced by mixing an inorganic filler and liquid thermosetting resin with an agitation mixture for about 10 minutes. The used agitation mixture has a vessel of a predetermined capacity to which an inorganic filler and liquid thermosetting resin are input, and while the vessel is rotated, it revolves; the agitation mixture provides a sufficient dispersion state if the viscosity of the mixture is comparatively high. As the mould releasing film, a polyethylene terephthalate film was used and mold release treatment with silicon was performed for the film surface.

Next, further a mould releasing film was put on the past-like mixture on the mould releasing film and they were pressed with a pressurizing press so that the thickness became 500 μm to provide a plate mixture. Next, the plate mixture sandwiched between the mould releasing film with the mould releasing film was heated and heat treatment was performed under the condition that adherence of the plate mixture disappears. In the heat treatment, a temperature of 120° C. is held for 15 minutes. The adherence of the plate mixture is lost by the heat treatment, so that it becomes easy to peel off the mould releasing film. The cure temperature of the liquid epoxy resin used in the example is 130° C. and thus the liquid epoxy resin is in an uncured state (B stage) under the condition.

Next, the mould releasing films were peeled off from the plate mixture, the plate mixture was sandwiched between heat-resistant mould releasing films (PPS: polyphenylene sulfite, thickness 75 μm), and while they were pressurized at pressure of 50 kg/cm$^2$, they were heated at a temperature of 170° C., thereby curing the plate mixture.

Next, the heat-resistant mould releasing films were peeled off from the cured plate mixture, thereby obtaining an insulating layer. The insulating layer was worked to predetermined dimensions and heat conductivity, coefficient of linear expansion, and the like were measured.

The heat conductivity was found by bringing the surface of a specimen cut to 10 mm per side into contact with a heating heater and calculation from a temperature rise from the opposite face. The coefficient of linear expansion was found by measuring dimension change of the insulating layer when the temperature was raised from room temperature to 140° C. and from the average value of the dimension change. Withstand voltage was found when AC voltage was applied in the thickness direction of the insulating layer, and the withstand voltage per unit thickness was calculated. Here, the insulating layer refers to a board in an electrically insulating state.

The heat conductivity of the insulating layer produced by the method described above became about 10 times or more that of a conventional glass-epoxy board (heat conductivity 0.2 w/mK to 0.3 w/mK) when $Al_2O_3$ was used as an inorganic filler. The amount of $Al_2O_3$ was set to 85% by weight, whereby the heat conductivity was able to set to 2.8 w/mK or more. $Al_2O_3$ also has an advantage of a low cost.

To use AlN, MgO as an inorganic filler, the heat conductivity equal to or more than that when $Al_2O_3$ was used was obtained. To use amorphous $SiO_2$ as an inorganic filler, the coefficient of linear expansion became closer to that of a silicon semiconductor (coefficient of linear expansion $3 \times 10^{-6}$/° C.). Therefore, the insulating layer using amorphous $SiO_2$ as an inorganic filler is preferred as a flip chip board where a semiconductor is directly mounted.

To use $SiO_2$ as an inorganic filler, an insulating layer of a low dielectric constant was obtained. $SiO_2$ also has an advantage of light specific gravity.

To use BN as an inorganic filler, an insulating layer having high heat conductivity and a low coefficient of linear expansion was obtained. The withstand voltage of the insulating layer was 10 kV/mm or more except for the case where $Al_2O_3$ of 60% by weight was used as an inorganic filler. The withstand voltage of the insulating layer becomes index of adherence of the inorganic filler of the material of the insulating layer and thermosetting resin. That is, if the adherence of the inorganic filler and the thermosetting resin is poor, a minute gap occurs between the inorganic filler and the thermosetting resin and the withstand voltage lowers. Such a minute gap results in reliability lowering of a module containing circuit components. Generally, if the withstand voltage is 10 kV/mm or more, it can be determined that the adherence of the inorganic filler and the thermosetting resin is good. Therefore, preferably the amount of the inorganic filler was 70% by weight or more.

If the content of the thermosetting resin is low, the strength of the insulating layer lowers. Thus, preferably the thermosetting resin is 4.8% by weight or more.

In the example, epoxy resin (WE-2025, anhydride-based curing agent is contained) manufactured by Nippon Pelnox Corporation was used as the liquid epoxy resin. Phenol resin (phenolight, VH4150) manufactured by Dainippon Ink (kabu) was used as the phenol resin. Cyanate resin (AroCy, M-30) manufactured by Asahi Chiba (kabu) was used as the cyanate resin. In the example, carbon black or a dispersing agent was added as an additive.

The composite sheet is sandwiched between the first stack board 10 and the second stack board 30 and they are pressurized and are heated, whereby a board used with an electronic circuit is obtained.

A connector is attached to the board and the board is attached to a mother board and is placed in the housing 101 through thermal-conductivity rubber and a heat slinger and a semiconductor device can be obtained.

Example 1 described above can also be applied to the following embodiments.

FIG. 17 shows the measurement results of an electromagnetic field distribution of the module. In FIGS. 17, (a) and (b) show the measurement results of the electric field peak value at 61.34 MHz about MS230 of a conventional large-sized board and MS250 of the board of the example. In FIG. 17, (c) and (d) show the measurement results of the electric field peak value at 125 MHz about MS230 and MS250. An area in which the contour line density is high indicates an area in which electric field strength change is large. The electric field peak value at the transmission time is 104.25 dBuV in MS230 at 61.3 MHz; while, it is 98.92 dBuV in MS250. As the difference between the electric field peak values at the transmission time, it is seen that the module of the example is lower than the module of M230 by 5.53 BuV. The electric field peak value at the transmission time is 96.47 dBuV in MS230 at 125 MHz; while, it is 90.33 dBuv in MS250. As the difference between the electric field peak values at the transmission time, it is seen that the module of the example is lower than the module of M230 by 6.14 BuV. Measurement is also conducted in higher frequency areas, MS230 and MS250 almost equal.

Figure 18:
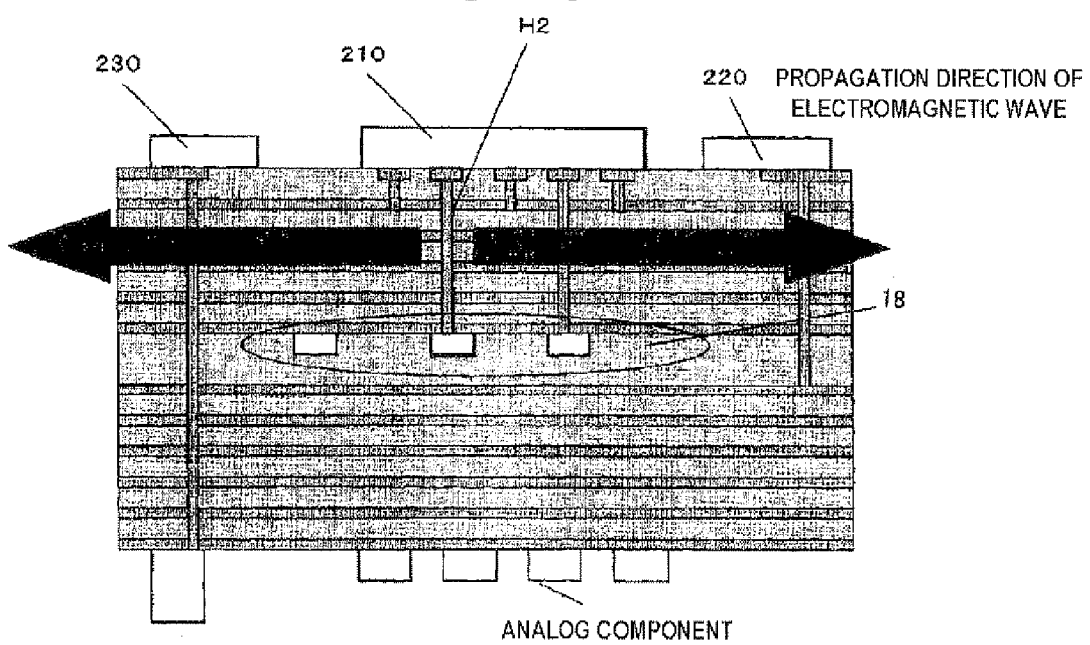
FIG. 18 is a schematic representation of operation of the first stack board of the PLC circuit module of Embodiment 1.

FIG. 18 shows an appearance of unnecessary radiation emitted from the conducting path provided in the through via H2.

A digital signal processed in the PLC IC 210 flows through the conducting path and unnecessary radiation is emitted in a perpendicular direction relative to the conducting path implemented as the through via H2. The unnecessary radiation emitted from the conducting path occurs in the perpendicular direction relative to the board face of the stack boards as indicated in arrows in the figure and is shielded by the conductor layers 11 to 16 and 31 to 36 in the circuit module 200. Thus, the strength of the unnecessary radiation emitted to the outside of the circuit module 200 becomes smaller than the strength of the unnecessary radiation occurring in the conducting path.

Thus, the conducting path is provided in the perpendicular direction relative to the second face 200*b* where the analog components are mounted, so that the propagation direction of the unnecessary radiation occurring in the conducting path as indicated in the arrows becomes parallel to the second face 200*b*. Therefore, the unnecessary radiation does not propagate to the second face 200*b*, so that it is made possible to suppress the effect of the unnecessary radiation received by the analog components.

In FIG. 18, built-in electronic components refer to the built-in electronic component 182 in FIG. 3 and the circuit components 18 in FIG. 12, and the analog components refer to the balanced filters 260 and the operational amplifier 252 in FIG. 3.

The AFE IC 220 for performing analog signal processing and the Ethernet (registered trademark) PHY IC 230 for performing digital signal processing on the mount face of the circuit module 200 are provided in one end and an opposite end of the mount face. An electronic circuit for performing analog signal processing such as the AFE IC 220 receives the effect of noise occurring from an electronic circuit for performing digital signal processing. Therefore, it is desirable that both should be provided away from each other as much as possible for decreasing the effect of noise occurring from the electronic circuit for performing digital signal processing.

As shown in FIG. 4, the connector 120 is provided at a position overlapping the projection face of the Ethernet (registered trademark) PHY IC 230 on the mount face of the connector 120. The connector and the Ethernet (registered trademark) PHY IC 230 are thus mounted, whereby the length of the via H2 electrically connecting the Ethernet (registered trademark) PHY IC 230 and the connector 120 can be shortened, so that it is made possible to suppress noise occurring from the via H2. As shown in FIG. 18, the via H2 is provided perpendicularly to the mount face of the circuit module 200, whereby it is made possible to minimize noise occurring from the via H2.

FIG. 18 shows only one via H2 for simplicity, but a plurality of vias H2 may be provided.

(Embodiment 2)

Figure 15:
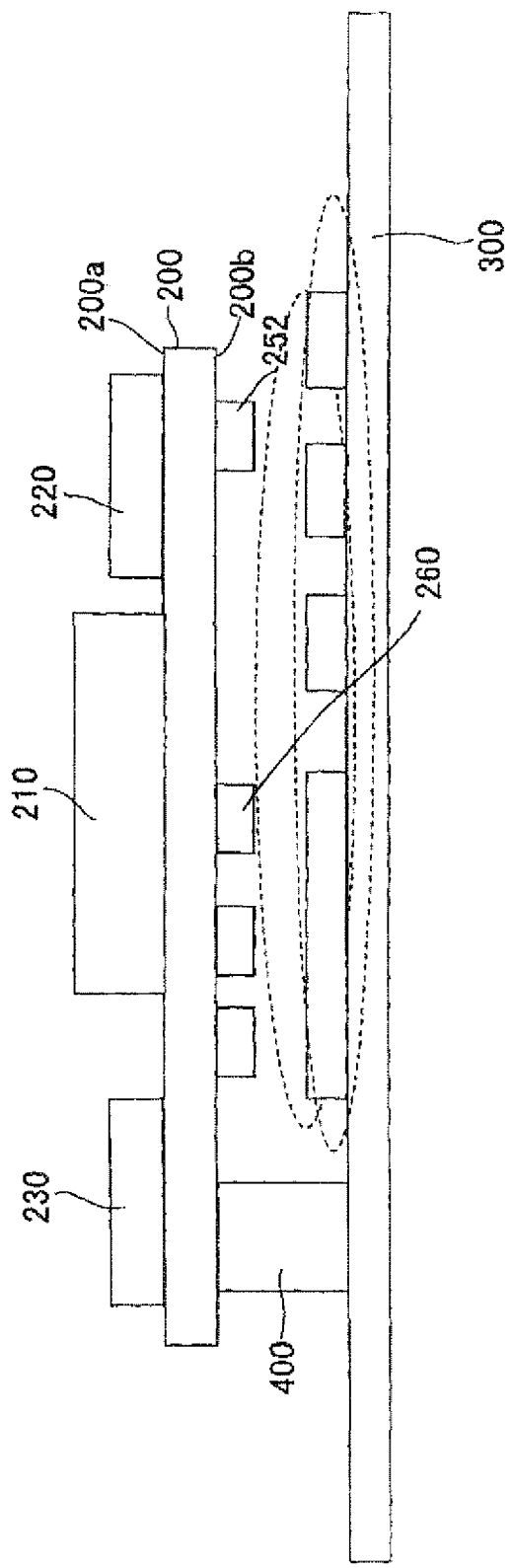
FIG. 15 is a schematic representation to show a PLC circuit module of Embodiment 2.

Next, Embodiment 2 will be described. In Embodiment 1 described above, to house the module in the housing 101, the heat slinger is attached through rubber as an elastic body having good heat conductivity. However, the module may be housed in the housing 101 as it is through no elastic body and no heat slinger as shown in FIG. 15.

(Embodiment 3)

Next, Embodiment 3 will be described.

Figure 16:
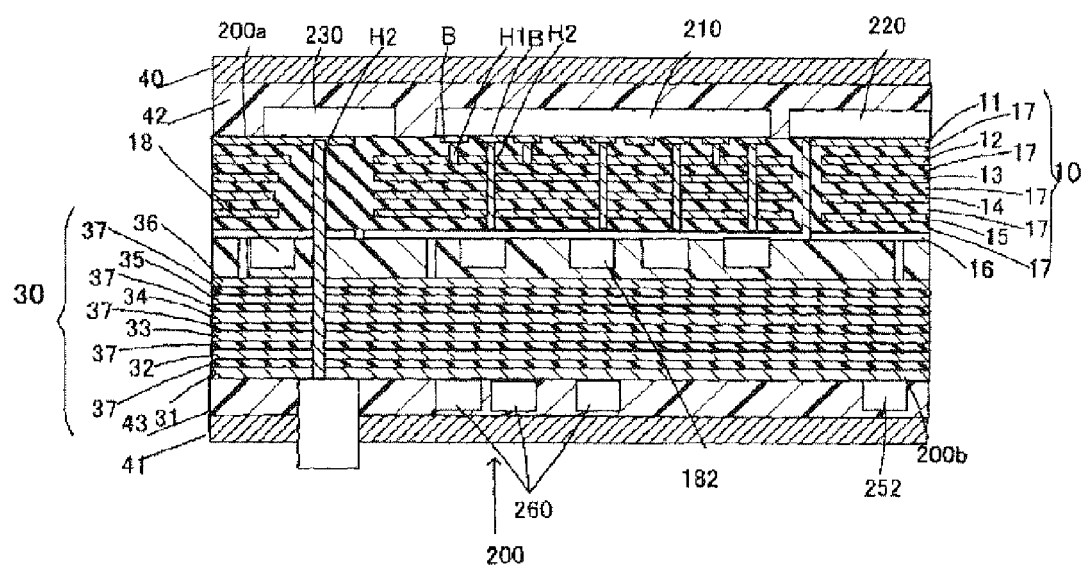
FIG. 16 is a schematic representation to show a PLC circuit module of Embodiment 3.

In the embodiment, as shown in FIG. 16, metal plates 40 and 41 for radiation are stacked through composite sheets 42 and 43 on the upper and lower faces of the PLC module provided in Embodiment 1 described above to form a PLC module, whereby radiation as the module is performed effectively. Others are formed like the PLC module of Embodiment 1 shown in FIG. 1. Parts identical with those in FIG. 1 are denoted by the same reference numerals in FIG. 16. A connector 120 as a connection part does not exist in the cross section and thus is not shown although it appears when the module is cut in another cross section.

According to the configuration, when the circuit integration degree increases, heat slingers are formed at the same time on the upper and lower faces, whereby the radiation area can be widened and a small-sized and low-cost module can be configured.

The case where the number of metal plates for radiation is two has been described, but the number of metal plates may be one. For example, only an integrated circuit with the largest heating value (for example, main IC) is provided with a metal plate through a composite sheet, whereby the radiation area can be widened.

(Embodiment 4)

Next, Embodiment 4 will be described.

Figure 19:
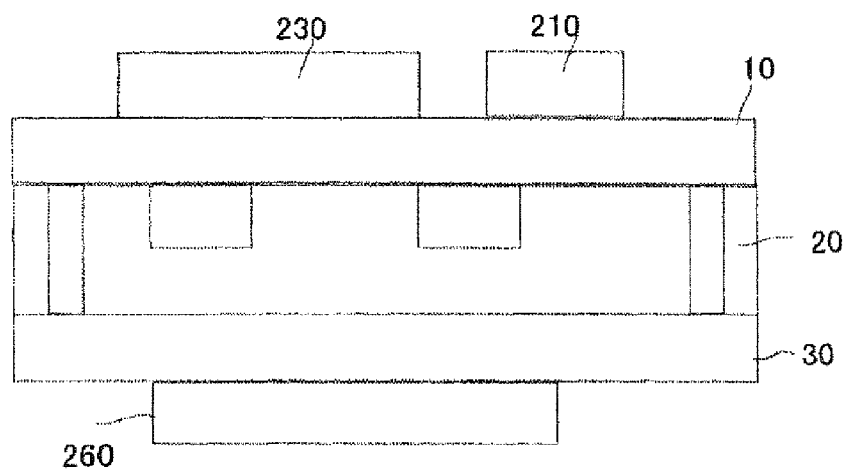
FIG. 19 is a schematic representation of a PLC circuit module of Embodiment 4.

The embodiment is characterized by the fact that first and second stack boards 10 and 30 are thinner than a composite sheet 20 as an insulating sheet intervened between the first and second stack boards as shown in a schematic drawing of FIG. 19.

According to the configuration, stress caused by thermal expansion of the first and second boards can be decreased, so that lowering of the junction property of the boards and the insulating sheet can be suppressed.

Figure 20:
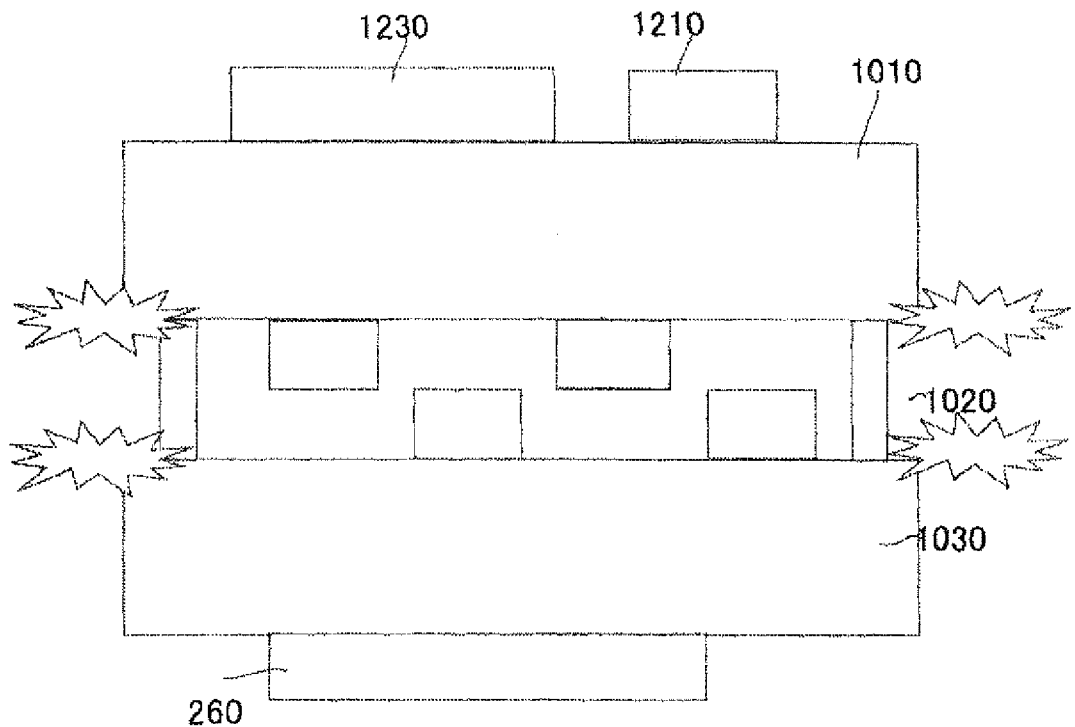
FIG. 20 is a schematic representation of a PLC circuit module of a comparison example.

Conventionally, as shown in FIG. 20, the number of layers of stack boards 1010 and 1030 is often determined by the circuit wiring amount. Thus, if the wiring amount is large, the number of layers of stack boards increases and the thickness increases. There is a problem in that as the board is thicker, warpage stress caused by the difference in the coefficient of thermal expansion becomes large and the junction reliability of a composite sheet 1020 and conductive paste for junction lowers. However, according to the embodiment, the first and second stack boards 10 and 30 are made thinner than the composite sheet 20, whereby the stress caused by heat expansion of the board is decreased and the junction reliability of the boards and the composite sheet, namely, through via can be improved.

(Embodiment 5)

Next, Embodiment 5 will be described.

Figure 21:
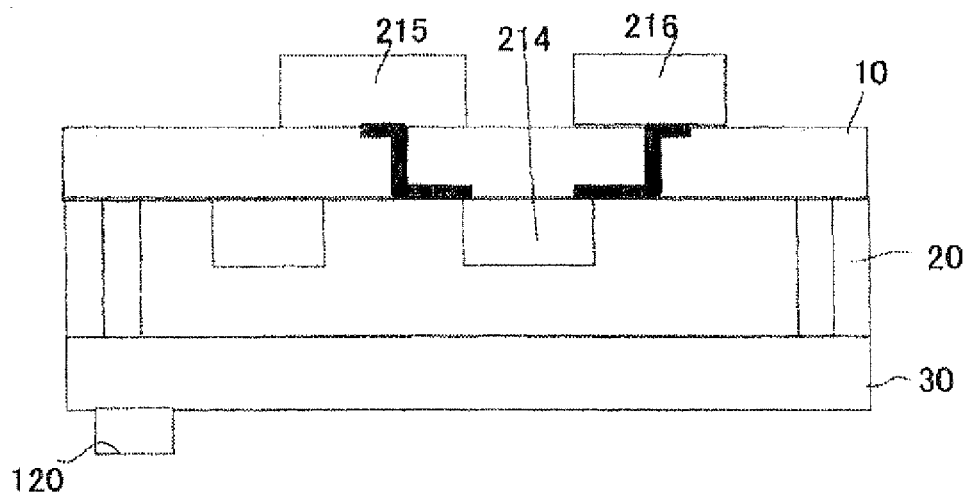
FIG. 21 is a schematic representation of a PLC circuit module of Embodiment 5.

In the embodiment, a resistor connected between ICs 215 and 216 installed on a first stack board 10 is a contained circuit component 214 and connection is made through a via as shown in a schematic drawing of FIG. 21.

Figure 22:
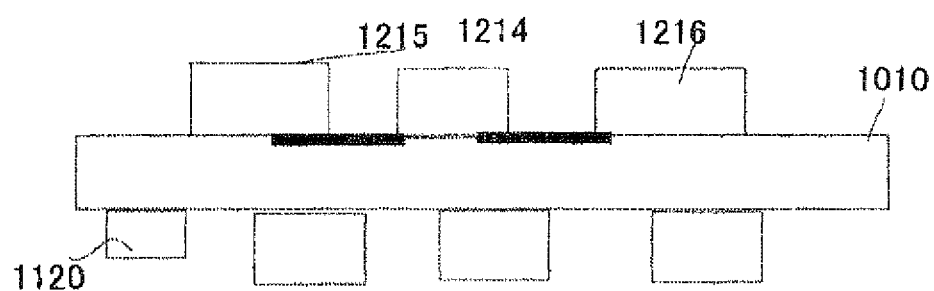
FIG. 22 is a schematic representation of a PLC circuit module of a comparison example.

For comparison, FIG. 22 shows the case where a resistor 1214 is placed on a first stack board 1010 and the ICs 1215 and 1216 are connected.

From the comparison between FIGS. 21 and 22, according to the configuration, the resister 214 is contained, whereby the spacing between the ICs 215 and 216 can be decreased and in addition, wiring for connection can be contained, so that unnecessary radiation caused by an impedance mismatch can be confined in the board.

(Embodiment 6)

Next, Embodiment 6 will be described.

As shown in schematic drawings of (a) to (c) in FIG. 23, digital components (Ethernet (registered trademark) PHY IC 230, PLC IC 210, and memory IC 220) are mounted on a first face 200a of a PLC module 200, a balanced filter 260 is mounted on a second face 200b opposed to the first face 200a, and the second face 200b is opposed to a mount board (mother board), so that the balanced filter 260 can circumvent the effect of noise from the digital components and the noise can be decreased.

The digital components mounted on the first face 200a are connected as the contained circuit components through a resistor 213. In FIG. 23, (a) is a sectional view, in FIG. 23, (b) shows the first face, and in FIG. 23, (c) shows the second face. DA indicates a digital area and AA indicates an analog area.

According to the configuration, if unnecessary radiation occurs because of the impedance mismatch between characteristic impedance of wiring and a resistor, the resistor is a contained circuit component and thus the wiring is also confined in the contained portion and unnecessary radiation can be confined in a board. The connection wiring of the digital components can be not only contained, but also formed as an inner layer in a stack board, wiring is facilitated, and the wiring length is also decreased. Spacing between the digital components can be minimized and wiring for connection of the digital components and the contained circuit components can also be confined in the contained portion. The distance between the digital components is lessened, so that the wiring length between the digital components can be shortened and a signal loop causing unnecessary radiation to occur can be lessened. Therefore, the unnecessary radiation can be decreased.

While the invention has been described in detail with reference to the specific embodiments, it will be obvious to those skilled in the art that various changes and modifications can be made without departing from the spirit and the scope of the invention.

This application is based on Japanese Patent Application No. 2008-076372 filed on Mar. 24, 2008 and Japanese Patent Application No. 2008-076373 filed on Mar. 24, 2008, the contents of which are incorporated herein by reference.

Industrial Applicability

According to the electronic circuit board and the power line communication apparatus of the embodiments described above, particularly, the installation positions of the heating components of the operation amplifier, etc., are placed on the face opposite to the digital components and are placed away from the connection part, so that the radiation property is enhanced and the effect of noise can be circumvented. Thus, the invention can be applied to various fields of high-speed power line communications, etc.

The invention claimed is:

1. An electronic circuit board to be connected to a different electronic circuit board and including a first board having a first face and a second board having a second face, the first face and the second face being substantially parallel to each other and located on opposite end faces of the electronic circuit board, the electronic circuit board comprising:

a first circuit, configured as a digital component, mounted on one end of the first face for performing analog signal processing;

a second circuit, configured as a digital component, mounted on another end of the first face for performing digital signal processing;

a connection part mounted on the second face and to be connected to the different electronic circuit board;

a filter, configured as an analog component, for blocking a signal of a predetermined frequency band is provided on the second face; and a first conducting path for electrically connecting the second circuit and the connection part, wherein the connection part is mounted at a position overlapping the second circuit when viewed in a direction orthogonal to the first face and the second face, the electronic circuit board further comprising a PLC (power line circuit) integrated circuit mounted on the first face between the first circuit and the second circuit, for performing at least one of modulation processing and demodulation processing of a multicarrier signal.

2. The electronic circuit board as claimed in claim 1, wherein an electronic component for performing the analog signal processing is mounted on the second face.

3. The electronic circuit board as claimed in claim 1, wherein at least one of the first board and the second board has a plurality of conductive layers stacked through an insulating layer.

4. The electronic circuit board as claimed in claim 1, further comprising:

an integrated circuit mounted on the first face for performing at least one of modulation processing and demodulation processing of a multicarrier signal.

5. The electronic circuit board as claimed in claim 1, wherein a radiation section is provided to abut on at least one of the first circuit and the second circuit.

6. The electronic circuit board as claimed in claim 4, wherein the multicarrier signal is a power line communication signal that is transmittable on a power line.

7. A power line communication apparatus for conducting power line communications, comprising:

the electronic circuit board as claimed in claim 6; and a coupler that is adapted to superpose the power line communication signal output from the electronic circuit board on an AC voltage transmitted through the power line, separating the power line communication signal from the AC voltage transmitted through the power line, and outputting the power line communication signal to the electronic circuit board.

8. The electronic circuit board as claimed in claim 5, wherein the radiation section is connected to the first circuit and the second circuit through an insulative elastic body.

9. The electronic circuit board as claimed in claim 6, wherein a filter for blocking the power line communication signal of a predetermined frequency band is provided on the second face.

10. The electronic circuit board as claimed in claim 9, wherein the filter is a balanced filter where impedances viewed from a pair of lines of the power line are almost the same.

11. The electronic circuit board as claimed in claim 1, wherein the first board has a third face opposed to the first face, the second board has a fourth face opposed to the second face, and the electronic circuit board comprises:

a junction layer provided between the third face and the fourth face for jointing the first board and the second board; and a built-in electronic component built into the junction layer.

12. The electronic circuit board as claimed in claim 11, further comprising:

a second conducting path for electrically connecting an integrated circuit and the built-in electronic component.

13. The electronic circuit board as claimed in claim 12, wherein the second conducting path is provided perpendicularly to the first face.

14. The electronic circuit board as claimed in claim 11, wherein the thickness of the first board and the thickness of the second board are smaller than the thickness of the junction layer.

15. The electronic circuit board as claimed in claim 11, wherein the junction layer includes an inorganic filler and a thermosetting resin.

16. The electronic circuit board as claimed in claim 15, wherein the inorganic filler in the junction layer is 70% by weight to 95% by weight.

17. The electric circuit board as claimed in claim 1, wherein the first conducting path is provided perpendicularly to the first face.

* * * * *